(12) United States Patent
Lo et al.

(10) Patent No.: US 11,594,506 B2
(45) Date of Patent: Feb. 28, 2023

(54) SEMICONDUCTOR PACKAGE

(71) Applicant: Advanced Semiconductor Engineering, Inc., Kaohsiung (TW)

(72) Inventors: Pei-Jen Lo, Kaohsiung (TW); Shun-Tsat Tu, Kaohsiung (TW); Cheng-En Weng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 111 days.

(21) Appl. No.: 17/030,181

(22) Filed: Sep. 23, 2020

(65) Prior Publication Data
US 2022/0093548 A1 Mar. 24, 2022

(51) Int. Cl.
*H01L 23/00* (2006.01)

(52) U.S. Cl.
CPC .............. *H01L 24/08* (2013.01); *H01L 24/09* (2013.01); *H01L 2224/08145* (2013.01); *H01L 2224/0903* (2013.01); *H01L 2224/09515* (2013.01)

(58) Field of Classification Search
CPC ................................ H01L 24/08; H01L 24/09
See application file for complete search history.

(56) References Cited

U.S. PATENT DOCUMENTS

| | | | | |
|---|---|---|---|---|
| 9,666,573 B1 * | 5/2017 | Sukekawa | | H01L 24/94 |
| 2016/0343763 A1 * | 11/2016 | Kagawa | | H01L 24/06 |
| 2016/0351551 A1 * | 12/2016 | Mei | | H01L 23/5384 |
| 2017/0069593 A1 * | 3/2017 | Chou | | H01L 23/498 |
| 2017/0317041 A1 * | 11/2017 | Yeh | | H01L 24/06 |
| 2017/0330848 A1 * | 11/2017 | Chen | | H01L 24/08 |
| 2017/0358562 A1 * | 12/2017 | Banna | | H01L 25/50 |
| 2018/0175266 A1 * | 6/2018 | England | | H01L 33/62 |
| 2018/0226366 A1 * | 8/2018 | Kim | | H01L 25/0655 |
| 2018/0277517 A1 * | 9/2018 | Kim | | H01L 43/08 |
| 2019/0096900 A1 * | 3/2019 | Matsuo | | H01L 27/11548 |
| 2019/0363079 A1 * | 11/2019 | Thei | | H01L 23/3192 |
| 2019/0393067 A1 * | 12/2019 | Wang | | H01L 21/67092 |
| 2020/0091115 A1 | 3/2020 | Wu et al. | | |
| 2021/0143096 A1 * | 5/2021 | Yun | | H01L 25/0657 |
| 2021/0159215 A1 * | 5/2021 | Wu | | H01L 24/80 |
| 2021/0159224 A1 * | 5/2021 | Shen | | H01L 23/5226 |
| 2021/0175181 A1 * | 6/2021 | Kim | | H01L 24/80 |
| 2021/0217716 A1 * | 7/2021 | Wu | | H01L 27/11556 |
| 2021/0265313 A1 * | 8/2021 | Chen | | H01L 21/56 |
| 2021/0296277 A1 * | 9/2021 | Iijima | | H01L 24/03 |
| 2021/0296298 A1 * | 9/2021 | Sanuki | | H01L 24/08 |
| 2021/0366855 A1 * | 11/2021 | Okina | | H01L 24/05 |
| 2021/0391302 A1 * | 12/2021 | Kao | | H01L 21/76895 |
| 2021/0398945 A1 * | 12/2021 | Parekh | | H01L 25/18 |
| 2021/0398957 A1 * | 12/2021 | Lan | | H03H 9/17 |

* cited by examiner

*Primary Examiner* — Nathan W Ha

(74) *Attorney, Agent, or Firm* — Foley & Lardner LLP

(57) ABSTRACT

A semiconductor package is provided. The semiconductor package includes a first conductive layer, a plurality of first conductive pads, a plurality of second conductive pads, and a first dielectric layer. The first conductive pads are electrically connected to the first conductive layer. The second conductive pads are electrically disconnected from the first conductive layer.

17 Claims, 23 Drawing Sheets

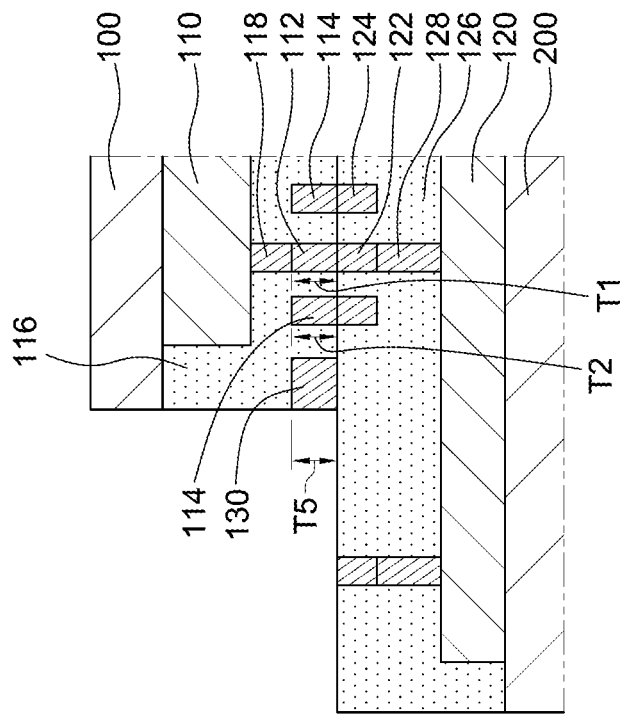
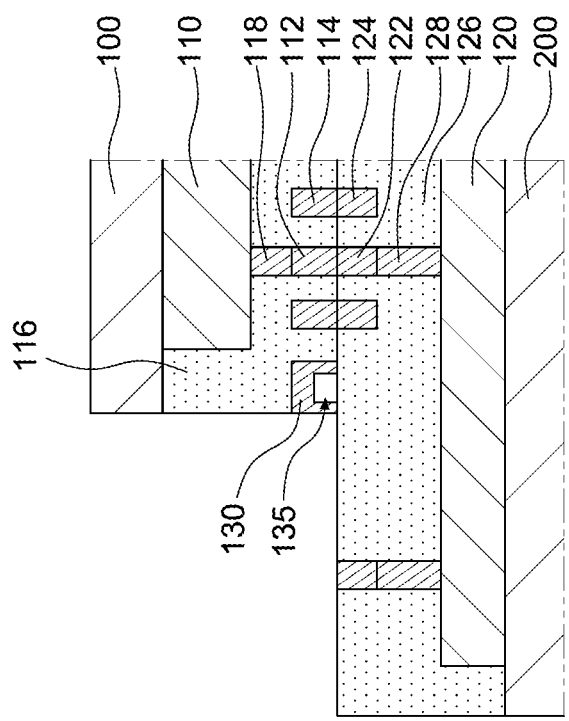
FIG. 6C
FIG. 6D

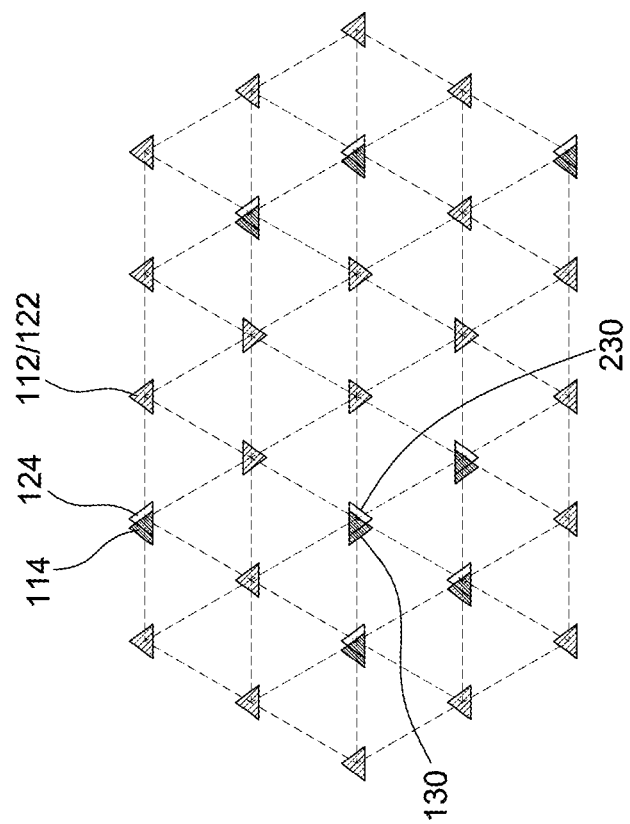

US 11,594,506 B2

SEMICONDUCTOR PACKAGE

BACKGROUND

1. Technical Field

The present disclosure relates generally to a semiconductor package.

2. Description of the Related Art

Dies may be bonded to a semiconductor wafer through various hybrid bonding techniques. Currently, the dies and the semiconductor wafer are bonded after chemical mechanical polishing (CMP) processes being performed on the dies and the semiconductor wafer. Erosion may occur on particular portions of the planarized surfaces having generally greater metal density. The uneven bonding surfaces of the dies and the semiconductor wafer caused by may result in delamination, deteriorating the device reliability.

SUMMARY

In one or more embodiments, a semiconductor package includes a first conductive layer, a plurality of first conductive pads, a plurality of second conductive pads, and a first dielectric layer. The first conductive pads are electrically connected to the first conductive layer. The second conductive pads are electrically disconnected from the first conductive layer.

In one or more embodiments, a semiconductor package includes a first semiconductor device, a plurality of first conductive pads, and a plurality of second conductive pads. The first conductive pads are under a projection area of an inner region of a first semiconductor device. The second conductive pads are under a projection area of a peripheral region of the first semiconductor device and serve as an alignment mark.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 6C illustrates a cross-sectional view of a portion of a semiconductor package in accordance with some embodiments of the present disclosure;

FIG. 6D illustrates a cross-sectional view of a portion of a semiconductor package in accordance with some embodiments of the present disclosure;

FIG. 10B illustrates a top view of arrangements of conductive pads in accordance with some embodiments of the present disclosure;

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
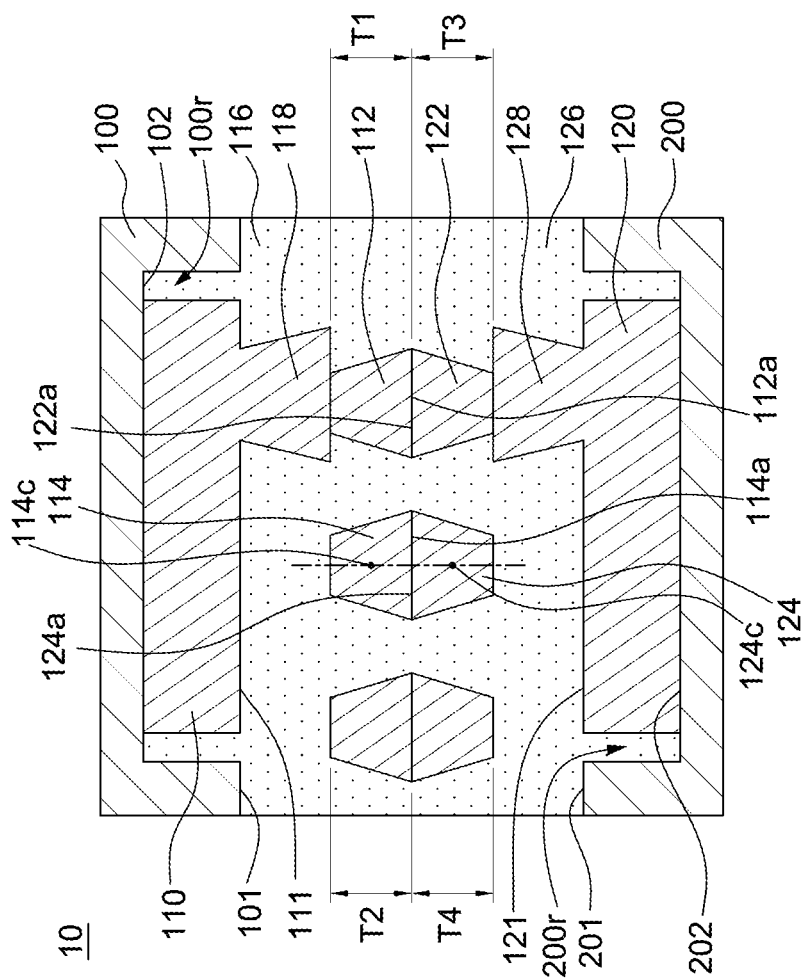
FIG. 1 illustrates a cross-sectional view of a hybrid bonding structure in accordance with some embodiments of the present disclosure.

FIG. 1 illustrates a cross-sectional view of a hybrid bonding structure 10 in accordance with some embodiments of the present disclosure. The hybrid bonding structure 10 includes conductive layers 110 and 120, conductive pads 112, 114, 122 and 124, dielectric layers 116 and 126, and connecting elements 118 and 128.

The conductive layer 110 is disposed on a semiconductor device 100. In some embodiments, the semiconductor device 100 may have a recess 100r (also referred to as "a cavity" or "a trench") recessed from an upper surface 101 of the semiconductor device 100, and the conductive layer 110 is disposed in the recess 100r of the semiconductor device 100. In some embodiments, the conductive layer 110 is disposed on a bottom surface 102 of the recess 100r, and an upper surface 111 of the conductive layer 110 may be substantially coplanar with or below the upper surface 101 of the semiconductor device 100. The conductive layer 110 may be formed of or include a conductive material such as a metal or metal alloy. Examples include gold (Au), silver (Ag), aluminum (Al), copper (Cu), or an alloy thereof.

The conductive pad 112 is electrically connected to the conductive layer 110, and the conductive pads 114 (also referred to as "floating conductive pads") are electrically disconnected from the conductive layer 110. In some embodiments, the conductive pads 114 are spaced apart from the conductive layer 110. In some embodiments, the hybrid bonding structure 10 may include a plurality of conductive pads 112 (not shown in FIG. 1). In some embodiments, the conductive pads 112 and 114 are distributed in a substantially uniform manner. For example, pitches between the conductive pads 112 and the conductive pads 114 adjacently disposed are substantially uniform. In some embodiments, the conductive pads 112 and 114 are distributed over a predetermined region of the conductive layer 110 in a substantially uniform manner. The conductive pads 112 and 114 may be formed of or include a conductive material such as a metal or metal alloy. Examples include gold (Au), silver (Ag), aluminum (Al), copper (Cu), or an alloy thereof. In some embodiments, the conductive pads 112 and 114 of the hybrid bonding structure 10 serve as bonding pads to hybrid bond one device (e.g., the semiconductor device 100) to another device (e.g., a semiconductor device 200, which will be discussed hereinafter). The conductive pads 112 and 114 may be planarized, for example, by a CMP process, prior to bonding the devices, and the planarized surfaces are bonding surfaces.

In some embodiments, pitches between the conductive pads 112 and the conductive pads 114 adjacently disposed are substantially the same. In some embodiments, a pitch between conductive pads 112 adjacently disposed, a pitch between the conductive pads 114 adjacently disposed, and a pitch between the conductive pads 112 and the conductive pads 114 adjacently disposed are substantially the same. In some embodiments, the term "distributed in a substantially uniform manner" is used herein to describe that the pitches between the conductive pads (e.g., the pitches between the conductive pads 112, the pitches between the conductive pads 114, and the pitches between the conductive pads 112 and 114) are approximately the same; for example, the range of variation of the pitches is less than or equal to ±10%, such as less than or equal to ±5%, less than or equal to ±4%, less than or equal to ±3%, less than or equal to ±2%, or less than or equal to ±1%.

According to some embodiments of the present disclosure, the conductive pads 112 and 114 are distributed in a substantially uniform manner so as to reduce the erosion effects on the surface of the dielectric layer 116 adjacent to the planarized bonding surfaces of the conductive pads 112 and 114, formation of uneven bonding surfaces of the conductive pads and disconnection of the surface of the dielectric layer can be prevented, and thus the bonding strength of the hybrid bonding structure 10 can be improved.

In addition, according to some embodiments of the present disclosure, the conductive pads 114 are electrically disconnected from the conductive layer 110 and function as floating conductive pads, thus undesired short circuit between the conductive pads 114 and the conductive layer 110 can be effectively prevented.

In some embodiments, a surface 112a (also referred to as "an upper surface") of each of the conductive pads 112 facing away from the conductive layer 110 and a surface 114a (also referred to as "an upper surface") of each of the conductive pads 114 facing away from the conductive layer 110 are at substantially the same elevation. In some embodiments, a bonding surface (e.g., the surface 112a) of at least one of the conductive pads 112 is substantially coplanar with a bonding surface (e.g., the surface 114a) of at least one of the conductive pads 114 proximal to the conductive layer 110. In some embodiments, a surface of each of the conductive pads 112 proximal to the conductive layer 110 is substantially coplanar with a surface of each of the conductive pads 114 proximal to the conductive layer 110. In some embodiments, a thickness T1 of the conductive pads 112 is substantially the same as a thickness T2 of the conductive pads 114. In some embodiments, at least one of the conductive pads 114 is substantially aligned with at least one of the conductive pads 124. In some embodiments, a geometric center 114c of each of the conductive pads 114 is substantially aligned with a geometric center 124c of each of the conductive pads 124. In some embodiments, an edge of each of the conductive pads 114 is substantially aligned with an edge of each of the conductive pads 124.

The dielectric layer 116 is between the conductive pads 112 and the conductive pads 114. In some embodiments, the dielectric layer 116 is disposed between the conductive pads 114 and the conductive layer 110. In some embodiments, the conductive pads 114 are spaced apart from the conductive layer 110 by the dielectric layer 116. In some embodiments, the dielectric layer 116 may include silicon-oxide ($SiO_x$), silicon-nitride ($SiN_x$), tantalum oxide ($TaO_x$) or the like.

The connecting element 118 is between the conductive layer 110 and at least one of the conductive pads 112. The connecting element 118 directly contacts the conductive layer 110 and the conductive pad 112 to electrically connect the conductive layer 110 and the conductive pad 112. In some embodiments, the conductive pads 112 are electrically connected to the conductive layer 110 through the connecting elements 118. In some embodiments, the connecting elements 118 are surrounded by the dielectric layer 116. The connecting element 118 may be formed of or include a conductive material such as a metal or metal alloy. Examples include gold (Au), silver (Ag), aluminum (Al), copper (Cu), or an alloy thereof.

The conductive layer 120 is disposed on a semiconductor device 200. In some embodiments, the semiconductor device 200 may have a recess 200r (also referred to as "a cavity" or "a trench") recessed from an upper surface 201 of the semiconductor device 200, and the conductive layer 120 is disposed in the recess 200r of the semiconductor device 200. In some embodiments, the conductive layer 120 is disposed on a bottom surface 202 of the recess 200r, and an upper surface 121 of the conductive layer 120 may be substantially coplanar with or below the upper surface 201 of the semiconductor device 200. The conductive layer 120 may be formed of or include a conductive material such as a metal or metal alloy. Examples include gold (Au), silver (Ag), aluminum (Al), copper (Cu), or an alloy thereof.

The conductive pad 122 is electrically connected to the conductive layer 120, and the conductive pads 124 are electrically disconnected from the conductive layer 120. In some embodiments, the conductive pads 124 are spaced apart from the conductive layer 120. In some embodiments, the hybrid bonding structure 10 may include a plurality of conductive pads 122 (not shown in FIG. 1). In some embodiments, pitches between the conductive pads 122 and the conductive pads 124 adjacently disposed are substantially the same. In some embodiments, the conductive pads 122 and 124 are distributed in a substantially uniform manner. For example, pitches between the conductive pads 122 and the conductive pads 124 adjacently disposed are substantially uniform. In some embodiments, the conductive pads 122 and 124 are distributed over a predetermined region of the conductive layer 120 in a substantially uniform manner. The conductive pads 122 and 124 may be formed of or include a conductive material such as a metal or metal alloy. Examples include gold (Au), silver (Ag), aluminum (Al), copper (Cu), or an alloy thereof. In some embodiments, the conductive pads 122 and 124 of the hybrid bonding structure 10 serve as bonding pads to hybrid bond one device (e.g., the semiconductor device 100) to another device (e.g., the semiconductor device 200). The conductive pads 122 and 124 may be planarized, for example, by a CMP process, prior to bonding the devices, and the planarized surfaces are bonding surfaces.

In some embodiments, a surface 122a (also referred to as "an upper surface") of each of the conductive pads 122 facing away from the conductive layer 120 and a surface 124a (also referred to as "an upper surface") of each of the conductive pads 124 facing away from the conductive layer 120 are at substantially the same elevation. In some embodiments, a thickness T3 of the conductive pads 122 is substantially the same as a thickness T4 of the conductive pads 124.

In some embodiments, at least one of the conductive pads 122 and 124 is bonded to at least one of the conductive pads 112 and 114. In some embodiments, at least one of the conductive pads 112 directly contacts at least one of the conductive pads 122. In some embodiments, at least one of the conductive pads 114 directly contacts at least one of the conductive pads 124. In some embodiments, at least one of the conductive pads 112 is bonded to at least one of the conductive pads 122. In some embodiments, at least one of the conductive pads 114 is bonded to at least one of the conductive pads 124. In some embodiments, the conductive pads 112 are bonded to the conductive pads 122, and the conductive pads 114 are bonded to the conductive pads 124.

The dielectric layer 126 is between the conductive pads 122 and the conductive pads 124. In some embodiments, the conductive pads 124 are spaced apart from the conductive layer 120 by the dielectric layer 126. In some embodiments, the dielectric layer 126 may include silicon-oxide ($SiO_x$), silicon-nitride ($SiN_x$), tantalum oxide ($TaO_x$) or the like.

The connecting element 128 is between the conductive layer 120 and at least one of the conductive pads 122. The connecting element 128 directly contacts the conductive layer 120 and the conductive pad 122 to electrically connect the conductive layer 120 and the conductive pad 122. The connecting element 128 may be formed of or include a conductive material such as a metal or metal alloy. Examples include gold (Au), silver (Ag), aluminum (Al), copper (Cu), or an alloy thereof.

According to some embodiments of the present disclosure, the conductive pads 124 are electrically disconnected from the conductive layer 120 and function as floating conductive pads, thus undesired short circuit between the conductive pads 124 and the conductive layer 120 can be effectively prevented.

In addition, according to some embodiments of the present disclosure, since the conductive pads 114 and 124 are already floating from the conductive layers 110 and 120, respectively, thus the conductive pads 114 do not have to be specifically made offset from the conductive pads 124 in order to prevent short circuit between the conductive pads 114 and the conductive pads 124. Therefore, the alignment precision requirement for the bonding process is lowered, the complexity of the manufacturing process is reduced accordingly, and since the extra space that could have been generated by the offset conductive pads is now saved, the package size can be further reduced.

Moreover, since the conductive pads 114 and 124 are floating from the conductive layers 110 and 120, respectively, the conductive pads 114 can directly contact and bond to the conductive pads 124 to achieve a relatively high hybrid bonding strength without causing undesired short circuit, and the bonding region with relatively low bonding strength resulted from bonding between heterogeneous materials (e.g., bonding between a conductive pad and a dielectric material) can be reduced accordingly. Therefore, the hybrid bonding structure 10 can provide relatively high hybrid strength for bonding devices.

Figures 2, 3:
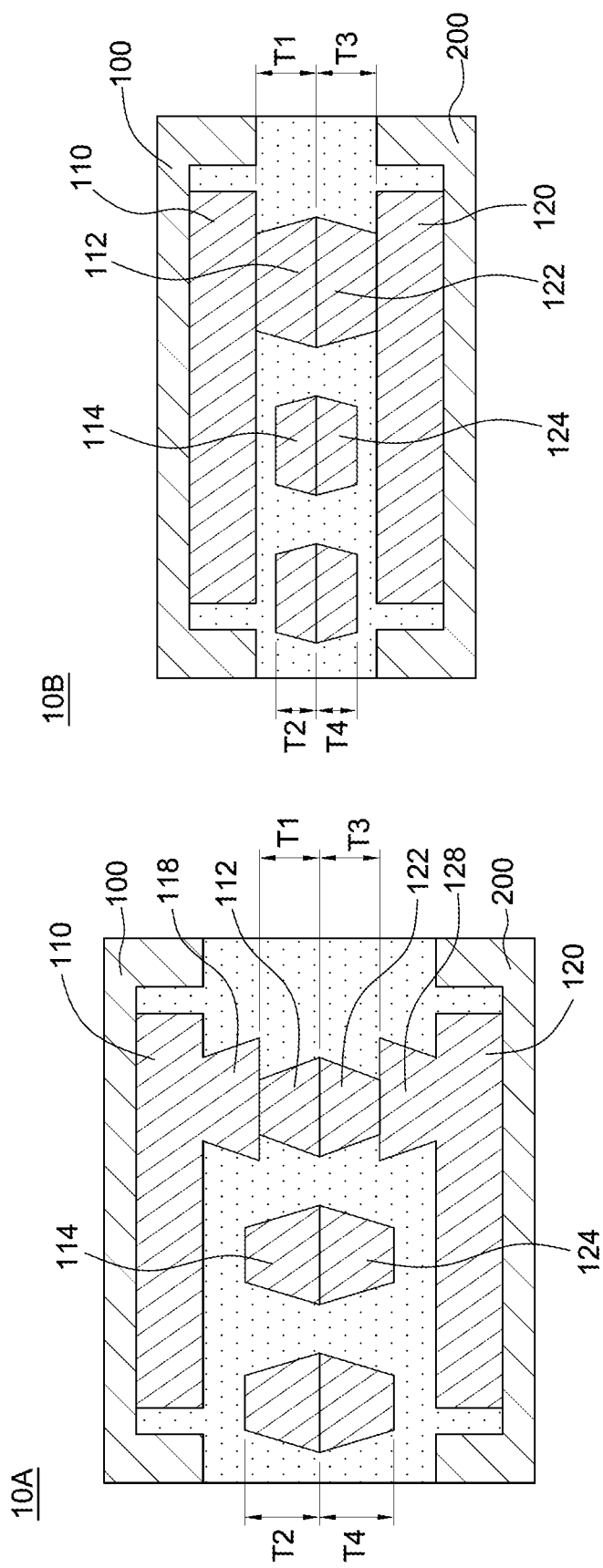
FIG. 2 illustrates a cross-sectional view of a hybrid bonding structure in accordance with some embodiments of the present disclosure.
FIG. 3 illustrates a cross-sectional view of a hybrid bonding structure in accordance with some embodiments of the present disclosure.

FIG. 2 illustrates a cross-sectional view of a hybrid bonding structure 10A in accordance with some embodiments of the present disclosure. The hybrid bonding structure 10A is similar to the hybrid bonding structure 10 in FIG. 1 except that, for example, the hybrid bonding structure 10A has a different design in the thicknesses of the conductive pads 112, 114, 122 and/or 124.

In some embodiments, the thickness T1 of the conductive pads 112 is different from the thickness T2 of the conductive pads 114. In some embodiments, the thickness T1 of the conductive pads 112 is less than the thickness T2 of the conductive pads 114. In some embodiments, a portion of the conductive pad 114 extends toward the conductive layer 110 and overlaps the connecting element 118 from a side view perspective.

In some embodiments, the thickness T3 of the conductive pads 122 is different from the thickness T4 of the conductive pads 124. In some embodiments, the thickness T3 of the conductive pads 122 is less than the thickness T4 of the conductive pads 124. In some embodiments, a portion of the conductive pad 124 extends toward the conductive layer 120 and overlaps the connecting element 128 from a side view perspective.

Accordingly to some embodiments of the present disclosure, with the extra spacing provided by the connecting elements 118 and 128, the chances of etching through the dielectric layers 116 and 126 to unintentionally reach the conductive layers 110 and 120 are greatly reduced, and thus the over-etching process on the dielectric layers 116 and 126 for forming the floating conductive pads 114 and 124 can be performed with less caution. Therefore, the manufacturing process for forming the floating conductive pads 114 and 124 can be simplified while the conductive pads 114 and 124 can remain perfectly disconnected from the conductive layers 110 and 120 by the dielectric layers 116 and 126.

FIG. 3 illustrates a cross-sectional view of a hybrid bonding structure 10B in accordance with some embodiments of the present disclosure. The hybrid bonding structure 10B is similar to the hybrid bonding structure 10 in FIG. 1 except that, for example, the hybrid bonding structure 10B does not include connecting elements 118 and 128.

In some embodiments, the conductive pads 112 directly contact the conductive layer 110. In some embodiments, the conductive pads 122 directly contact the conductive layer 120. In some embodiments, the thickness T1 of the conductive pads 112 is greater than the thickness T2 of the conductive pads 114. In some embodiments, the thickness T3 of the conductive pads 122 is greater than the thickness T4 of the conductive pads 124. Accordingly, the overall thickness of the hybrid bonding structure 10B can be significantly reduced.

Figure 4:
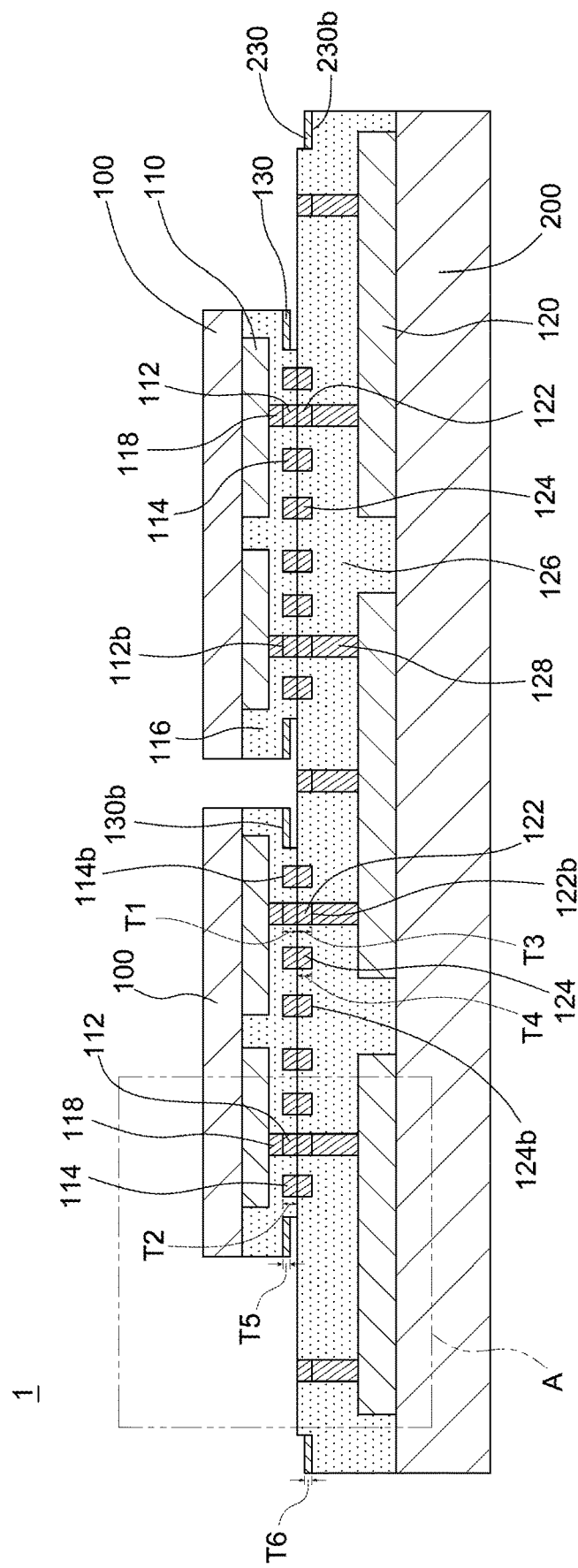
FIG. 4 illustrates a cross-sectional view of a semiconductor package in accordance with some embodiments of the present disclosure.

FIG. 4 illustrates a cross-sectional view of a semiconductor package 1 in accordance with some embodiments of the present disclosure. The semiconductor package 1 includes semiconductor devices 100 and 200, conductive pads 112, 114, 122, 124, 130 and 230, dielectric layers 116 and 126, and connecting elements 118 and 128.

In some embodiments, the semiconductor device 100 may be a chip, a die or a wafer including a semiconductor substrate, one or more integrated circuit devices and one or more overlying interconnection structures therein. The integrated circuit devices may include active devices such as transistors and/or passive devices such resistors, capacitors, inductors, or a combination thereof. In some embodiments, the semiconductor device 200 may be a chip, a die or a wafer. In some embodiments, a size of the semiconductor device 200 is greater than a size of the semiconductor device 100. In some embodiments, the semiconductor device 100 is hybrid bonded to the semiconductor device 200.

In some embodiments, the conductive pads 112 and 114 are distributed at an inner region of the semiconductor device 100 in a substantially uniform manner. In some embodiments, the conductive pads 112 and 114 are distributed at a projection area of an inner region of the semiconductor device 100 in a substantially uniform manner. In some embodiments, the conductive pads 112 and 114 are under a projection area of an inner region of the semiconductor device 100. In some embodiments, the conductive pads 122 and 124 are distributed at a projection area of the inner region of the semiconductor device 100 in a substantially uniform manner. In some embodiments, the conductive pads 122 and 124 are distributed at a projection area of the inner region of the semiconductor device 100 in a substantially uniform manner. The conductive pads 112 are electrically connected to the conductive layer 110, and the conductive pads 114 (also referred to as "floating conductive pads") are electrically disconnected from the conductive layer 110. The conductive pads 122 are electrically connected to the conductive layer 120, and the conductive pads 124 (also referred to as "floating conductive pads") are electrically disconnected from the conductive layer 120. In some embodiments, at least one of the conductive pads 112 directly contacts at least one of the conductive pads 122. In some embodiments, at least one of the conductive pads 114 directly contacts at least one of the conductive pads 124. In some embodiments, the conductive pads 112 are bonded to the conductive pads 122, and the conductive pads 114 are bonded to the conductive pads 124; thereby the semiconductor device 100 is hybrid bonded to the semiconductor device 200.

In some embodiments, the conductive pads 130 are distributed at a projection area of a peripheral region of the semiconductor device 100 in a substantially uniform manner. In some embodiments, the conductive pads 130 are under a projection area of a peripheral region of the semiconductor device 100. In some embodiments, the conductive pads 130 of the hybrid bonding structure 10 may be planarized, for example, by a CMP process, prior to bonding the devices. In some embodiments, the conductive pads 130 serve as alignment marks on the semiconductor device 100 for bonding the semiconductor device 100 and the semiconductor device 200. In some embodiments, a size of one of the conductive pads 130 is different from a size of one of the conductive pads 112 and 114 from a cross-sectional perspective. In some embodiments, a size of one of the conductive pads 130 is greater than 1.5 times a size of one of the conductive pads 112 and 114 from a cross-sectional perspective. In some embodiments, a thickness T5 of one of the conductive pads 130 is different from a thickness T1 of one of the conductive pads 112 and a thickness T2 of one of the conductive pads 114.

In some embodiments, the conductive pads 230 are distributed at a peripheral region of the semiconductor device 200 in a substantially uniform manner. In some embodiments, some of the conductive pads 230 may be located at predetermined scribing lines for subsequent singulation operations. In some embodiments, the conductive pads 230 serve as alignment marks on the semiconductor device 200 for bonding the semiconductor device 100 and the semiconductor device 200. The conductive pads 130 and 230 may be formed of or include a conductive material such as a metal or metal alloy. Examples include gold (Au), silver (Ag), aluminum (Al), copper (Cu), or an alloy thereof.

In some embodiments, the thickness T1 of the conductive pads 112 is different from a thickness T5 of the conductive pads 130. In some embodiments, the thickness T1 of the conductive pads 112 is greater than the thickness T5 of the conductive pads 130. In some embodiments, the thickness T2 of the conductive pads 114 is different from the thickness T5 of the conductive pads 130. In some embodiments, the thickness T2 of the conductive pads 114 is greater than the thickness T5 of the conductive pads 130. In some embodiments, bottom surfaces 130b of the conductive pads 130 and bottom surfaces 112b of the conductive pads 112 are at substantially the same elevation. In some embodiments, the bottom surfaces 130b of the conductive pads 130 and bottom surfaces 114b of the conductive pads 114 are at substantially the same elevation. In some embodiments, the conductive pads 130 are spaced apart from the conductive layer 110.

According to some embodiments of the present disclosure, the thickness T5 of the conductive pads 130 is different from the thickness T1/T2 of the conductive pads 112 and 114, therefore the conductive pads 130 can serve as alignment marks for bonding the semiconductor device 100 and the semiconductor device 200 because of the structural difference in the conductive pads 130 and the conductive pads 112/114. In some embodiments, the thickness T5 of the conductive pads 130 being less than the thickness T1/T2 of the conductive pads 112 and 114 is due to the fact that a size of the conductive pads 130 is greater than or equal to a size of the conductive pads 112/114. In some embodiments, the thickness T5 of the conductive pads 130 being less than the thickness T1/T2 of the conductive pads 112 and 114 is due to the fact that an areal density (i.e., areal metal density) of the conductive pads 130 is greater than or equal to an areal density (i.e., areal metal density) of the conductive pads 112/114. After the planarization operation (e.g., CMP), surface erosion is more prominent at the regions with greater metal areal density, an as a result, the thickness T5 of the conductive pad 120 may appear to be thinner than the thickness T1/T2 of the conductive pads 112/114. In some embodiments, the term "areal density" or "areal metal density" is used herein to describe the proportion of an area of metal to a total area of metal and oxides in a unit area.

In some embodiments, the thickness T3 of the conductive pads 122 is different from a thickness T6 of the conductive pads 230. In some embodiments, the thickness T3 of the conductive pads 122 is greater than the thickness T6 of the conductive pads 230. In some embodiments, the thickness T4 of the conductive pads 124 is different from the thickness T6 of the conductive pads 230. In some embodiments, the thickness T4 of the conductive pads 124 is greater than the thickness T6 of the conductive pads 230. In some embodiments, bottom surfaces 230b of the conductive pads 230 and bottom surfaces 122b of the conductive pads 122 are at substantially the same elevation. In some embodiments, the bottom surfaces 230b of the conductive pads 230 and bottom surfaces 124b of the conductive pads 124 are at substantially the same elevation. In some embodiments, the conductive pads 230 are spaced apart from the conductive layer 120.

In some embodiments, the dielectric layer 116 is between the conductive pads 112, 114 and 130. In some embodiments, the dielectric layer 126 is between the conductive pads 122, 124 and 230. In some embodiments, the conductive pads 130 are spaced apart from the dielectric layer 126.

Figure 5:
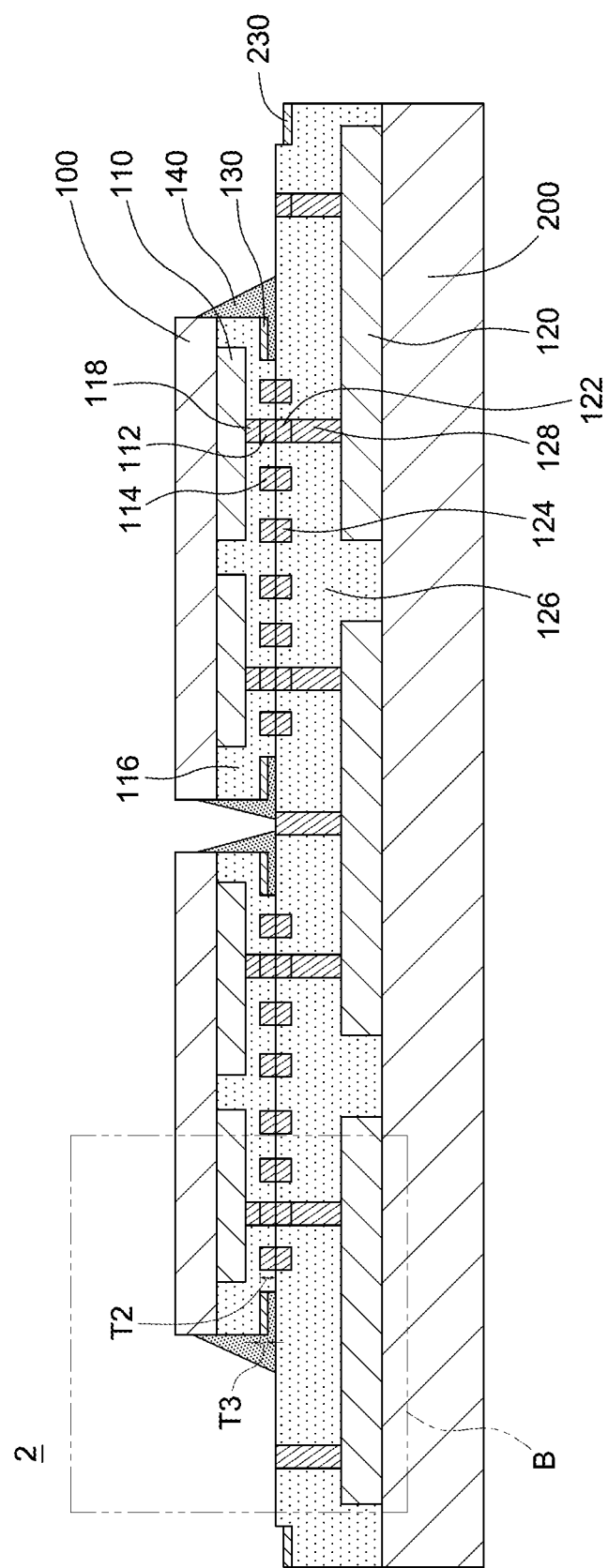
FIG. 5 illustrates a cross-sectional view of a semiconductor package in accordance with some embodiments of the present disclosure.

FIG. 5 illustrates a cross-sectional view of a semiconductor package 2 in accordance with some embodiments of the present disclosure. The semiconductor package 2 is similar to the semiconductor package 1 in FIG. 4 except that, for example, the semiconductor package 2 includes an encapsulant 140 (also referred to as "an underfill").

In some embodiments, the encapsulant 140 directly contacts at least one of the conductive pads 130. In some embodiments, a portion of the encapsulant 140 is between the conductive pad 130 and the dielectric layer 126. The encapsulant 140 may include an epoxy resin having fillers, a molding compound (e.g., an epoxy molding compound or other molding compound(s)), polyimide, a phenolic compound or material, a material with a silicone dispersed therein, or a combination thereof. Accordingly, the encapsulant 140 filled in-between the conductive pad 130 and the dielectric layer 126 can provide support and protection for the conductive pad 130.

Figure 6B:
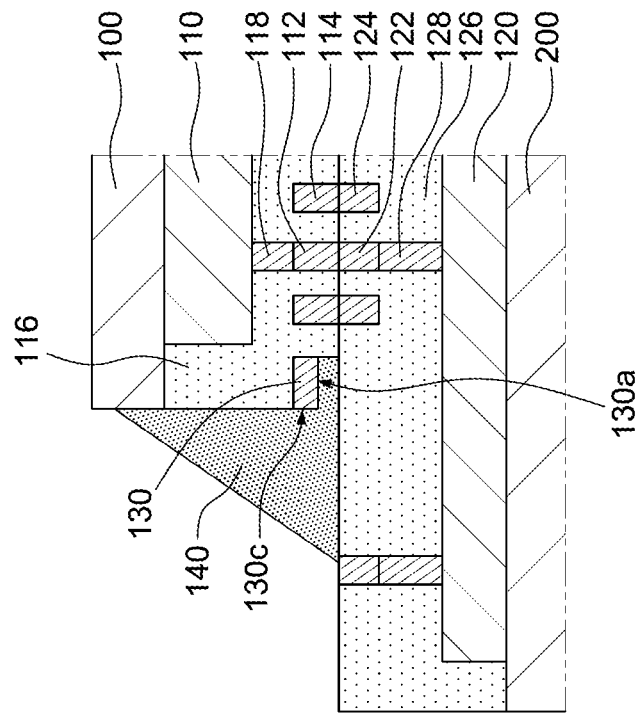
FIG. 6B illustrates a cross-sectional view of a portion of a semiconductor package in accordance with some embodiments of the present disclosure.
Figure 6A:
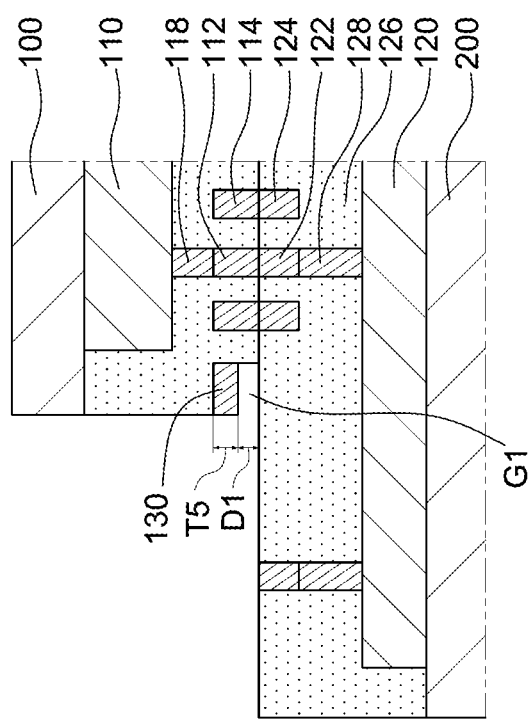
FIG. 6A illustrates a cross-sectional view of a portion of a semiconductor package in accordance with some embodiments of the present disclosure.

FIG. 6A illustrates a cross-sectional view of a portion of a semiconductor package in accordance with some embodiments of the present disclosure. For example, FIG. 6A may be an enlarged view of the structure in the dashed box A as shown in FIG. 4 according to some embodiments of the present disclosure.

In some embodiments, the conductive pad 130 is spaced apart from the dielectric layer 126 by a gap G1 (also referred to as "a void" or "a space"). In some embodiments, the conductive pad 130 is spaced apart from the dielectric layer 126 by a distance D1, and the distance D1 is smaller than the thickness T5 of the conductive pad 130.

FIG. 6B illustrates a cross-sectional view of a portion of a semiconductor package in accordance with some embodiments of the present disclosure. For example, FIG. 6B may be an enlarged view of the structure in the dashed box B as shown in FIG. 5 according to some embodiments of the present disclosure.

In some embodiments, at least one of the conductive pads 130 has a surface 130a (also referred to as "an upper surface") and a surface 130c (also referred to as "a lateral surface") angled with the surface 130a, and the encapsulant 140 directly contacts the surface 130a and the surface 130c of the conductive pad 130. In some embodiments, a portion of the encapsulant 140 extends in-between the dielectric layer 126 and the surface 130a of the conductive pad 130.

FIG. 6C illustrates a cross-sectional view of a portion of a semiconductor package in accordance with some embodiments of the present disclosure. For example, FIG. 6C may be an enlarged view of one of various possible structures in the dashed box A as shown in FIG. 4 according to some embodiments of the present disclosure.

In some embodiments, the conductive pad 130 and the dielectric layer 126 define a void 135. In some embodiments, the void 135 may be an air void. In some embodiments, a wall portion of the conductive pad 130 directly contacts the dielectric layer 126, and a cap portion of the conductive pad 130 is spaced apart from the dielectric layer 126. In some embodiments, the void 135 is enclosed by the conductive pad 130 and the dielectric layer 126. In some embodiments, the void 135 is a closed space fully surrounded by the conductive pad 130 and the dielectric layer 126.

FIG. 6D illustrates a cross-sectional view of a portion of a semiconductor package in accordance with some embodiments of the present disclosure. For example, FIG. 6D may be an enlarged view of one of various possible structures in the dashed box A as shown in FIG. 4 according to some embodiments of the present disclosure.

In some embodiments, the conductive pad 130 directly contacts the dielectric layer 126. In some embodiments, the thickness T5 of the conductive pad 130 is substantially the same as the thickness T1 of the conductive pad 112. In some embodiments, the thickness T5 of the conductive pad 130 is substantially the same as the thickness T2 of the conductive pad 114.

Figure 6E:
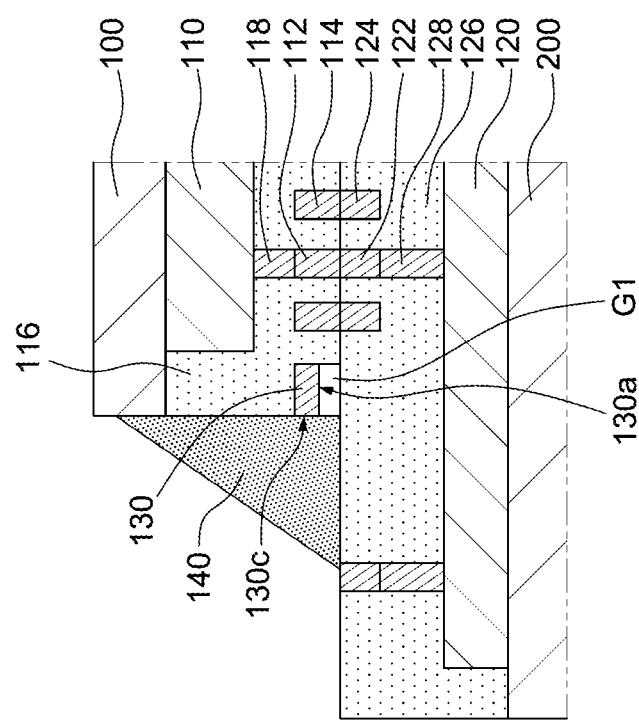
FIG. 6E illustrates a cross-sectional view of a portion of a semiconductor package in accordance with some embodiments of the present disclosure.

FIG. 6E illustrates a cross-sectional view of a portion of a semiconductor package in accordance with some embodiments of the present disclosure. For example, FIG. 6E may be an enlarged view of the structure in the dashed box B as shown in FIG. 5 according to some embodiments of the present disclosure.

In some embodiments, the encapsulant 140 directly contacts the surface 130c of the conductive pad 130, and the encapsulant 140 is spaced apart from at least a portion of the surface 130a of the conductive pad 130 by the gap G1 (also referred to as "the void" or "the space").

Figure 7B:
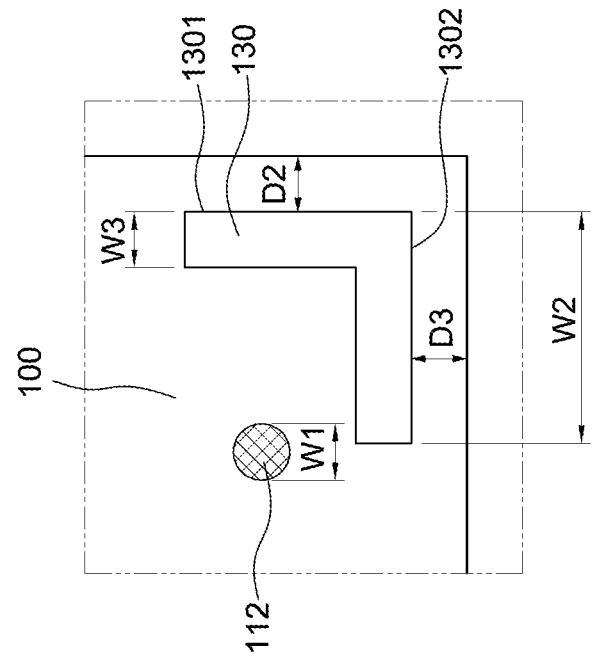
FIG. 7B illustrates a top view of conductive pads on a portion of a semiconductor device in accordance with some embodiments of the present disclosure.
Figure 7A:
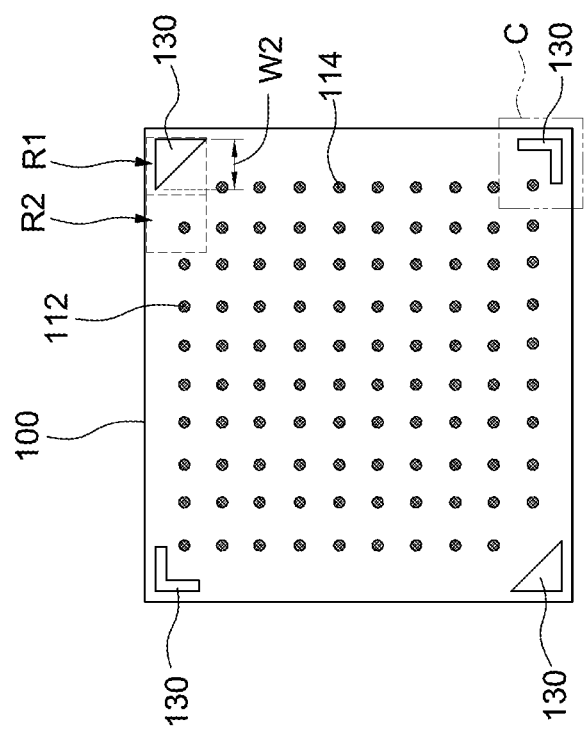
FIG. 7A illustrates a top view of conductive pads on a semiconductor device in accordance with some embodiments of the present disclosure.

FIG. 7A illustrates a top view of conductive pads 112, 114, and 130 on a semiconductor device 100 in accordance with some embodiments of the present disclosure.

In some embodiments, the conductive pads 130 are disposed at the peripheral region of the semiconductor device 100, for example, corners of the semiconductor device 100. In some embodiments, the conductive pads 130 may have different patterns at different corners of the semiconductor device 100. In some embodiments, a dimension of one of the conductive pads 130 is greater than 1.5 times a dimension of one of the conductive pads 112. In some embodiments, a dimension of one of the conductive pads 130 is greater than 4 times a dimension of one of the conductive pads 112. In some embodiments, a dimension of one of the conductive pads 130 is greater than 1.5 times a dimension of one of the conductive pads 114. In some embodiments, a dimension of one of the conductive pads 130 is greater than 4 times a dimension of one of the conductive pads 114. In some embodiments, a maximum width W1 (e.g., a diameter) of the conductive pad 112 and/or the conductive pad 114 is from about 3 μm to about 20 μm. In some embodiments, the maximum width W1 of the conductive pad 112 and/or the conductive pad 114 is from about 5 μm to about 15 μm. In some embodiments, the maximum width W1 of the conductive pad 112 and/or the conductive pad 114 is from about 8 μm to about 12 μm. In some embodiments, a maximum width W2 of the conductive pad 130 is from about 5 μm to about 250 μm. In some embodiments, the maximum width W2 of the conductive pad 130 is from about 20 μm to about 220 μm. In some embodiments, the maximum width W2 of the conductive pad 130 is from about 40 μm to about 200 μm.

In some embodiments, a size of the conductive pads 130 is greater than a size of the conductive pads 112 and 114. In some embodiments, a size of the conductive pads 130 is about 20% greater than a size of the conductive pads 112 and 114. In some embodiments, a size of the conductive pads 130 is about 30% greater than a size of the conductive pads 112 and 114. In some embodiments, a size of the conductive pads 130 is about 40% greater than a size of the conductive pads 112 and 114. For example, as shown in FIG. 7A, regions R1 and R2 have substantially the same area, and the size of the conductive pads 130 in the region R1 is greater than the size of the conductive pads 112 and 114 in the region R2. In some embodiments, an areal density of the conductive pads 130 is greater than an areal density of the conductive pads 112 and 114. In some embodiments, an areal density of the conductive pads 130 is about 20% greater than an areal density of the conductive pads 112 and 114. In some embodiments, an areal density of the conductive pads 130 is about 30% greater than an areal density of the conductive pads 112 and 114. In some embodiments, an areal density of the conductive pads 130 is about 40% greater than an areal density of the conductive pads 112 and 114. In some embodiments, the term "areal density" used herein is defined as the area of the conductive pads (e.g., the conductive pads 112, 114, 122, 124, 130 and 230) in a unit area divided by the unit area. For example, as shown in FIG. 7A, regions R1 and R2 have substantially the same area, and the areal density of the conductive pads 130 in the region R1 is greater than the areal density of the conductive pads 112 and 114 in the region R2.

FIG. 7B illustrates a top view of conductive pads 112 and 130 on a portion of a semiconductor device 100 in accordance with some embodiments of the present disclosure. For example, FIG. 7B may be an enlarged view of the structure in the dashed box C as shown in FIG. 7A according to some embodiments of the present disclosure.

In some embodiments, the conductive pad 130 includes two extending portions angled to each other. In some embodiments, the two extending portion form an L-shaped pattern. In some embodiments, the two extending portions are respectively spaced apart from two edges of the semiconductor device 100 by a distance D2 and a distance D3. In some embodiments, the distance D2 and the distance D3 are substantially the same. In some embodiments, the distances D2 and D3 are from about 3 μm to about 50 μm.

In some embodiments, the maximum width W2 (i.e., the longitudinal side of the extending portion) is from about 40 μm to about 200 μm. In some embodiments, the maximum width W2 (i.e., the longitudinal side of the extending portion) is from about 160 μm to about 180 μm. In some embodiments, a width W3 (i.e., the short side) of the extending portion is from about 30 μm to about 80 μm. In some embodiments, the width W3 (i.e., the short side) of the extending portion is from about 40 μm to about 60 μm.

Figure 7C:
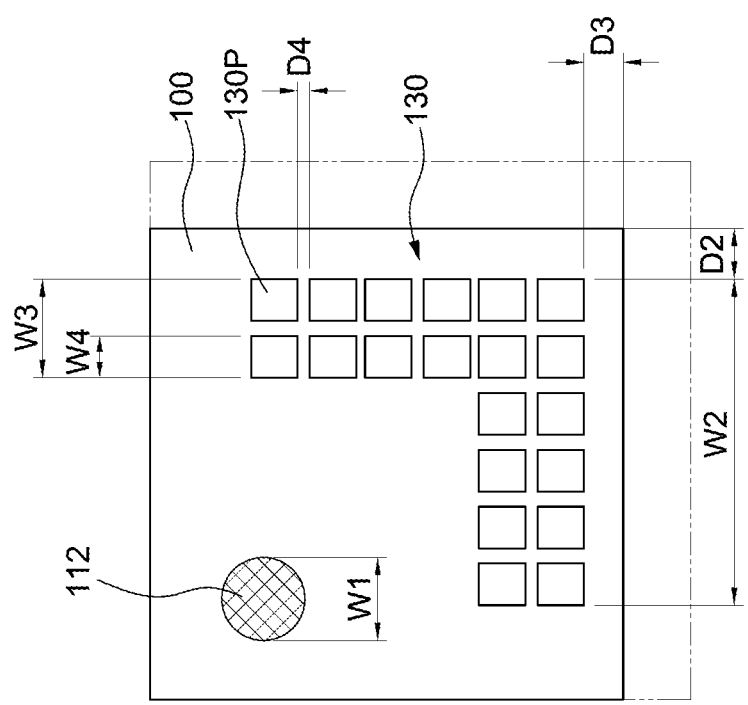
FIG. 7C illustrates a top view of conductive pads on a portion of a semiconductor device in accordance with some embodiments of the present disclosure.

FIG. 7C illustrates a top view of conductive pads 112 and 130 on a portion of a semiconductor device 100 in accordance with some embodiments of the present disclosure. For example, FIG. 7C may be an enlarged view of one of various possible structures in the dashed box C as shown in FIG. 7A according to some embodiments of the present disclosure.

In some embodiments, the conductive pad 130 at a corner of the semiconductor device 100 may include a plurality of conductive portions 130p. In some embodiments, each of the conductive portions 130p has a maximum width W4 from about 15 μm to about 25 μm, for example, about 20 μm. In some embodiments, every two adjacent conductive portions 130p are separated by a distance D4 from about 7 μm to about 13 μm, for example, about 10 μm.

Figure 8:
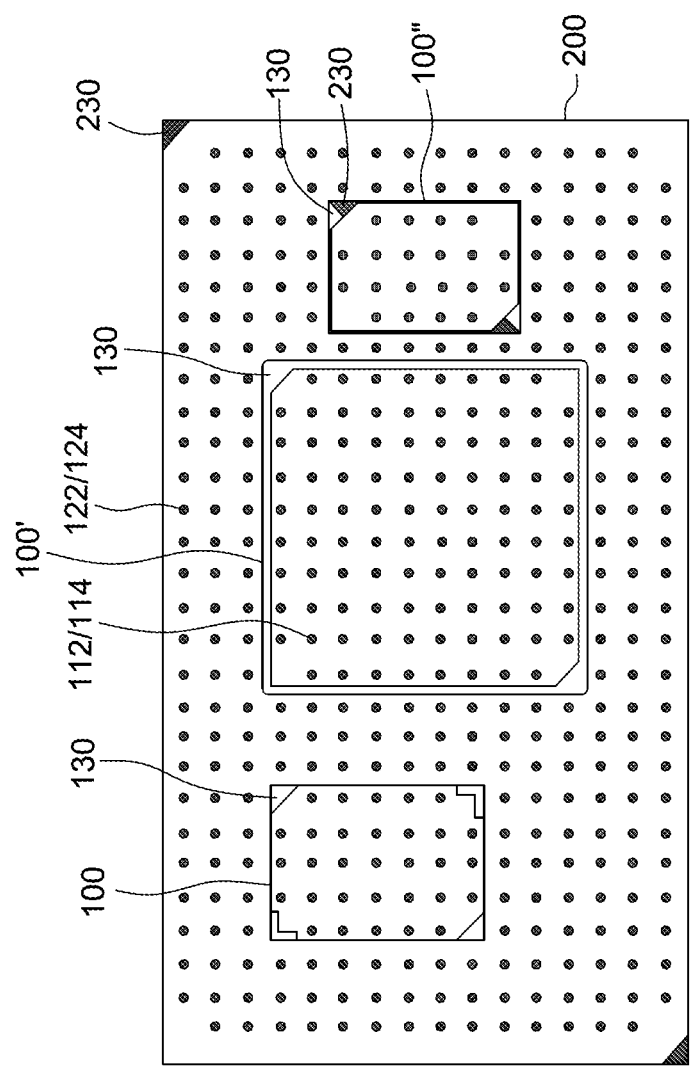
FIG. 8 illustrates a top view of conductive pads on a semiconductor package in accordance with some embodiments of the present disclosure.

FIG. 8 illustrates a top view of conductive pads 112, 114, 122, 124, 130 and 230 on a semiconductor package 1 in accordance with some embodiments of the present disclosure.

In some embodiments, the conductive pads 130 may serve as alignment marks and located at four corners of a semiconductor device 100. The conductive pads 130 at different corners may have different sizes, shapes, and/or patterns from one another. In some embodiments, a size of the conductive pads 130 is greater than a size of the conductive pads 112 and 114. In some embodiments, an areal density of the conductive pads 130 is greater than an areal density of the conductive pads 112 and 114. In some embodiments, a pattern and/or shape of the conductive pads 130 is different from a pattern and/or shape of the conductive pads 112 and 114.

In some embodiments, the conductive pads 130 may serve as alignment marks and form a ring structure at the peripheral region of a semiconductor device 100'. In some embodiments, the conductive pads 130 may surround the semiconductor device 100'. In some embodiments, the ring structure may have protruded patterns at one or more corners of the semiconductor device 100'. These protruded patterns may have different sizes and/or shapes.

In some embodiments, the conductive pads 130 may serve as alignment marks and located at two or more corners of a semiconductor device 100". In some embodiments, the conductive pads 230 may serve as alignment marks and located at two or more corners of a semiconductor device 200'. In some embodiments, at least one of the conductive pads 130 and at least one of the conductive pads 230 are in a substantially mirror-symmetric arrangement. In some embodiments, at least one of the conductive pads 130 and at least one of the conductive pads 230 are in a substantially mirror-symmetric arrangement at one of the corners of the semiconductor device 100".

Figure 9:
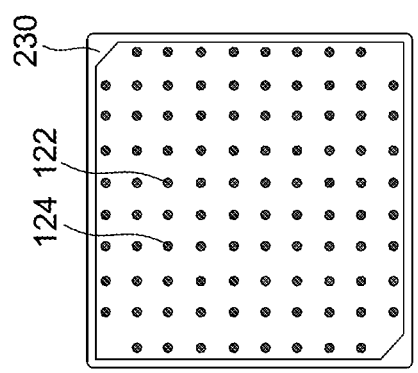
FIG. 9 illustrates a top view of conductive pads on a semiconductor device in accordance with some embodiments of the present disclosure.

FIG. 9 illustrates a top view of conductive pads 122, 124 and 230 on a semiconductor device 200 in accordance with some embodiments of the present disclosure. In some embodiments, a size of the conductive pads 230 is greater than a size of the conductive pads 122 and 124. In some embodiments, an areal density of the conductive pads 230 is greater than an areal density of the conductive pads 122 and 124. In some embodiments, a pattern and/or shape of the conductive pads 230 is different from a pattern and/or shape of the conductive pads 122 and 124. In some embodiments, the conductive pads 230 may serve as alignment marks and form a ring structure at the peripheral region of a semiconductor device 200. In some embodiments, the conductive pads 230 may surround the semiconductor device 200. In some embodiments, the ring structure may have protruded patterns at one or more corners of the semiconductor device 200. These protruded patterns may have different sizes and/or shapes.

Figure 10A:
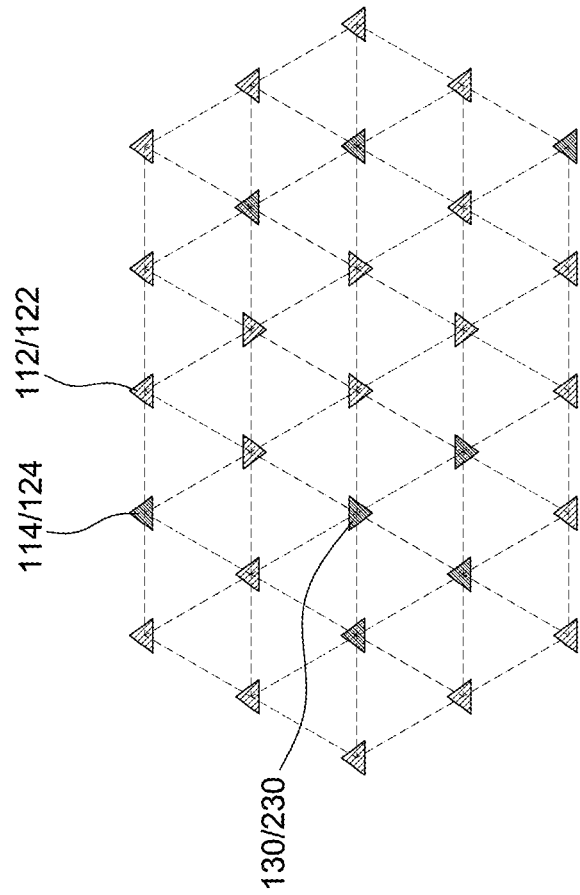
FIG. 10A illustrates a top view of arrangements of conductive pads in accordance with some embodiments of the present disclosure.

FIG. 10A illustrates a top view of arrangements of conductive pads 112, 114, 122, 124, 130 and 230 in accordance with some embodiments of the present disclosure. In some embodiments, the conductive pads 112 are aligned with the conductive pads 122. In some embodiments, the conductive pads 114 are aligned with the conductive pads 124. In some embodiments, the conductive pads 130 are aligned with the conductive pads 230. In some embodiments, the top view shown in FIG. 10A may have a cross-sectional view shown in FIG. 2.

In some embodiments, the conductive pads 112 and 114 may be formed in the same operation, e.g., including the same etching operation to form recesses and the same operation to fill a conductive material in the recesses, and thus the pitches between the conductive pads 112 and 114 are substantially uniform. For example, the connecting element 118 shown in FIG. 2 may serve as an etch stop layer for the aforesaid etching operation. Similar situation may apply to the conductive pads 122 and 124.

FIG. 10B illustrates a top view of arrangements of conductive pads 112, 114, 122, 124, 130 and 230 in accordance with some embodiments of the present disclosure. In some embodiments, the conductive pads 112 are aligned with the conductive pads 122. In some embodiments, the conductive pads 114 are misaligned with the conductive pads 124. In some embodiments, the conductive pads 130 are misaligned with the conductive pads 230. In some embodiments, the top view shown in FIG. 10B may have a cross-sectional view shown in FIG. 3.

In some embodiments, the conductive pads 112 and 114 may be formed in different operations, e.g., including the two etching operations to form recesses for the conductive pads 112 and recesses for the conductive pads 114, and thus the pitches between the conductive pads 112 and the pitches between the conductive pads 112 and 114 are be slightly different due to the alignment errors of lithography. For example, the different thicknesses of the conductive pads 112 and the conductive pads 114 shown in FIG. 3 may be formed from the aforesaid two etching operations. Similar situation may apply to the conductive pads 122 and 124.

Figure 11:
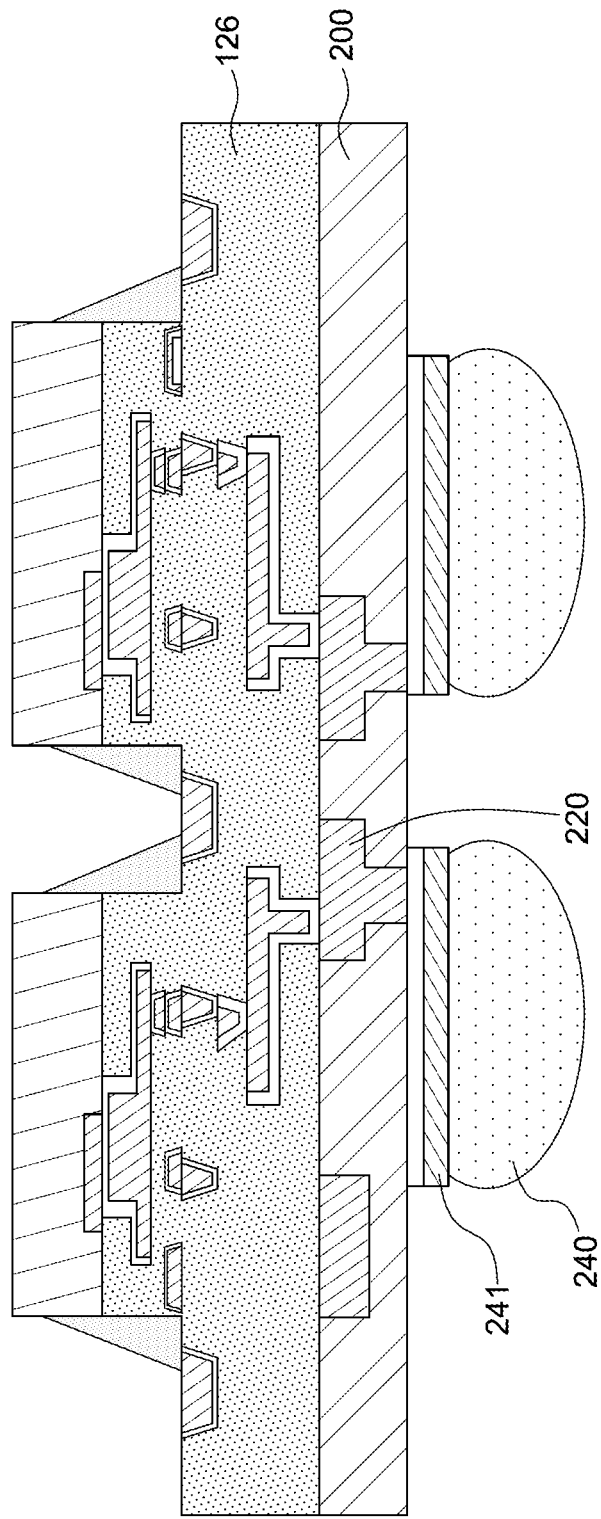
FIG. 11 illustrates a cross-sectional view of a semiconductor package in accordance with some embodiments of the present disclosure.

FIG. 11 illustrates a cross-sectional view of a semiconductor package 3 in accordance with some embodiments of the present disclosure. The semiconductor package 3 includes semiconductor devices 100 and 200, conductive pads 112, 114, 122, 124, 130 and 230, dielectric layers 116 and 126, an encapsulant 140, connecting elements 118 and 128, under bump metallurgy layers (UBM layers) 241, and electrical contacts 240.

In some embodiments, the semiconductor device 100 includes a redistribution layer (RDL) 210 connected to the conductive layer 110. In some embodiments, the encapsulant 140 covers a portion of the conductive pad 230.

In some embodiments, the semiconductor device 200 includes an RDL 220 connected to the conductive layer 120. In some embodiments, the conductive layer 120 is connected to the UBM layer 241 and the electrical contact 240 through the RDL 220. The conductive contacts 240 may include a controlled collapse chip connection (C4) bump, a ball grid array (BGA) or a land grid array (LGA).

Figure 12:
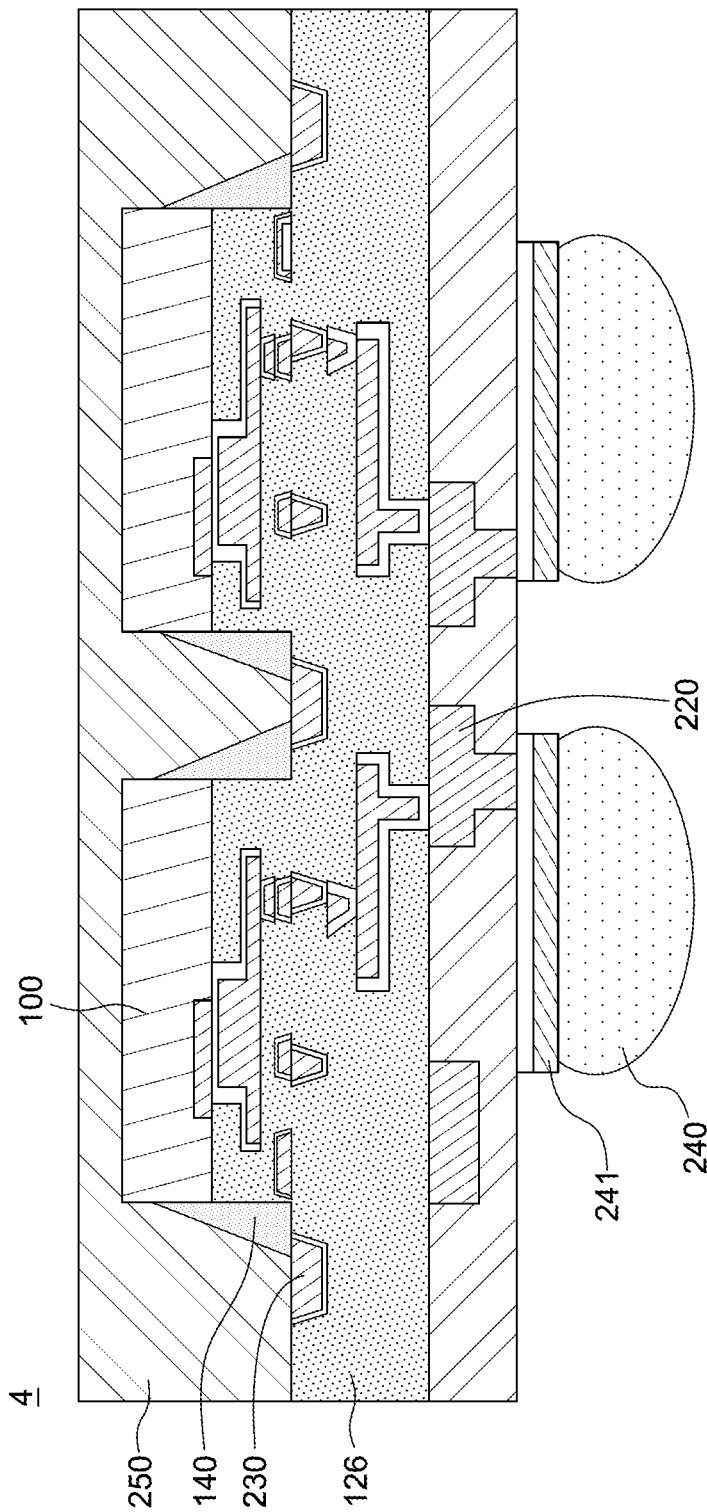
FIG. 12 illustrates a cross-sectional view of a semiconductor package in accordance with some embodiments of the present disclosure.

FIG. 12 illustrates a cross-sectional view of a semiconductor package 4 in accordance with some embodiments of the present disclosure. The semiconductor package 4 is similar to the semiconductor package 3 in FIG. 11 except that, for example, the semiconductor package 4 includes an encapsulant 250.

In some embodiments, the encapsulant 250 covers the semiconductor devices 100. In some embodiments, the encapsulant 250 directly contacts the encapsulant 140 and the conductive pads 230. The encapsulant 250 may include an epoxy resin having fillers, a molding compound (e.g., an epoxy molding compound or other molding compound(s)), polyimide, a phenolic compound or material, a material with a silicone dispersed therein, or a combination thereof.

Figure 13:
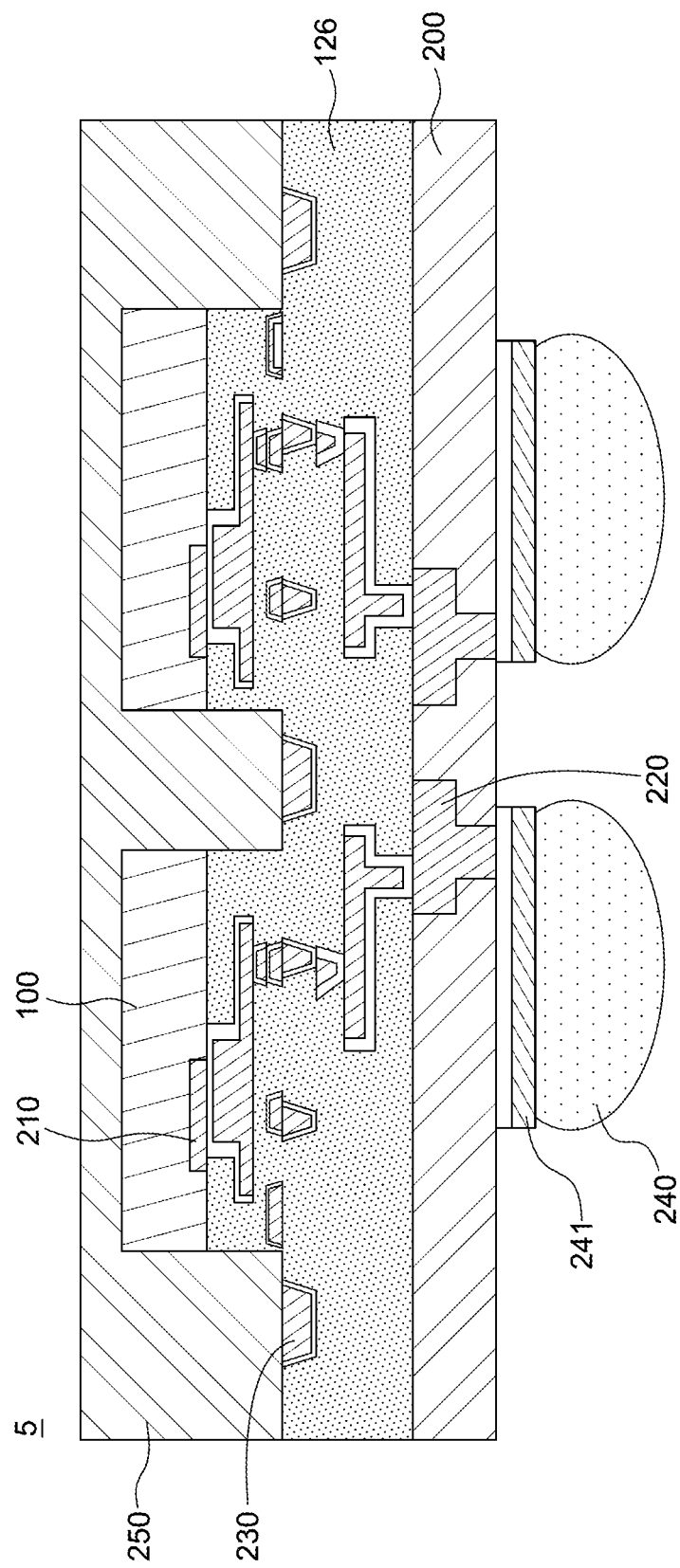
FIG. 13 illustrates a cross-sectional view of a semiconductor package in accordance with some embodiments of the present disclosure.

FIG. 13 illustrates a cross-sectional view of a semiconductor package 5 in accordance with some embodiments of the present disclosure. The semiconductor package 5 is similar to the semiconductor package 4 in FIG. 12 except that, for example, the semiconductor package 5 does not include an encapsulant 140.

Figure 14:
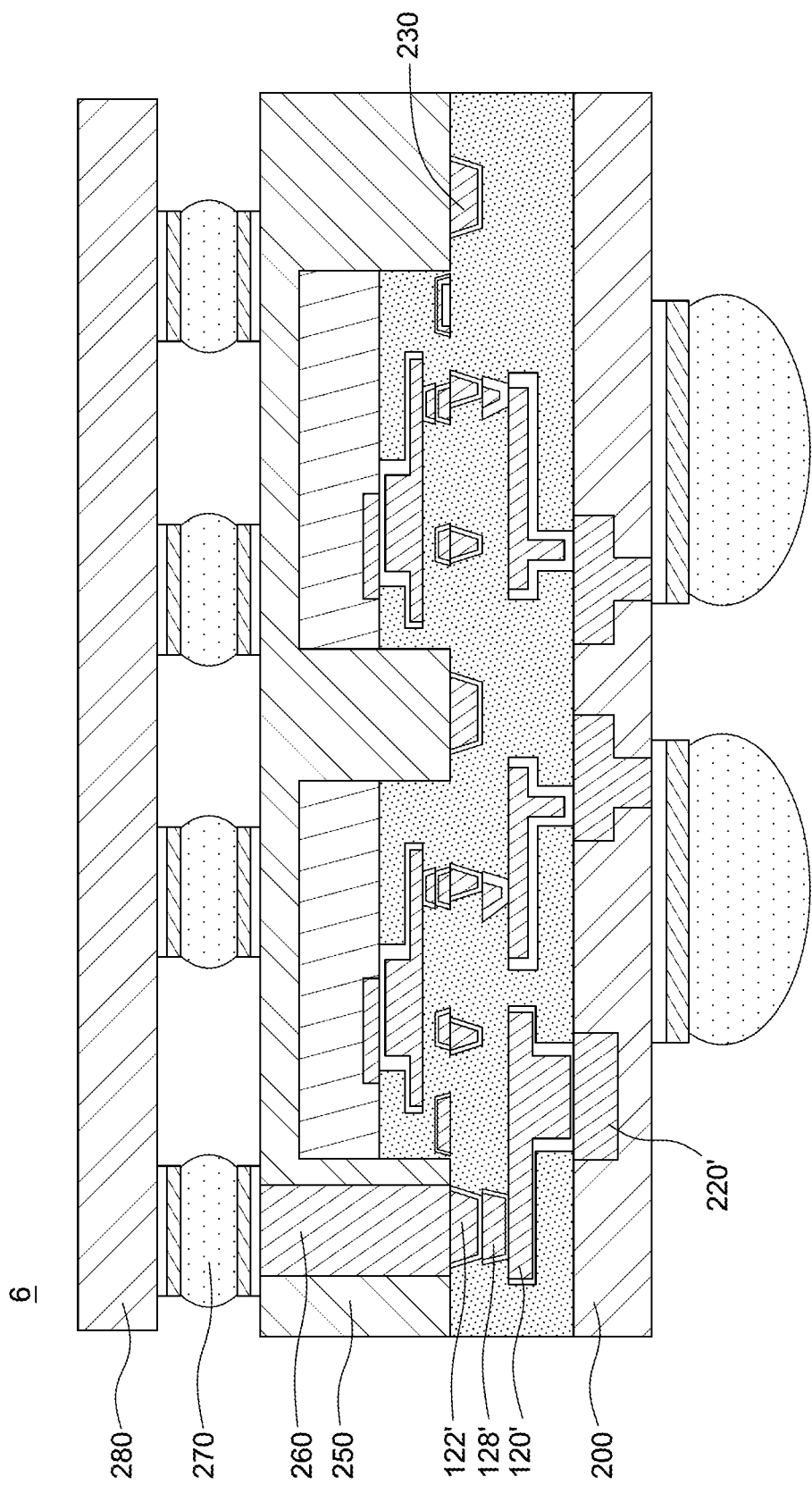
FIG. 14 illustrates a cross-sectional view of a semiconductor package in accordance with some embodiments of the present disclosure.

FIG. 14 illustrates a cross-sectional view of a semiconductor package 6 in accordance with some embodiments of the present disclosure. The semiconductor package 6 is similar to the semiconductor package 3 in FIG. 11 except that, for example, the semiconductor package 6 includes an encapsulant 250, a conductive structure 260, electrical contacts 270, a substrate 280, a conductive layer 120', a conductive pad 122', and a connecting element 128'.

In some embodiments, the conductive structure 260 passes through the encapsulant 250 to connect the electrical contact 270 and the conductive pad 122'. The conductive pad 122' may be connected to a RDL 220' of the semiconductor device 200 through the connecting element 128' and the conductive layer 120'. In some embodiments, the conductive structure 260 is connected to the substrate 280 through the electrical contact 270. The conductive structure 260 may include a through via. The conductive contacts 270 may include a controlled collapse chip connection (C4) bump, a ball grid array (BGA) or a land grid array (LGA). The substrate 280 may include a chip or a die, one or more integrated circuit devices, and one or more overlying interconnection structures.

FIG. 15A, FIG. 15B, FIG. 15C, FIG. 15D, FIG. 15E, FIG. 15F, FIG. 15G, FIG. 15H, FIG. 15I, FIG. 15J and FIG. 15K illustrate various operations in a method of manufacturing a semiconductor package 5 in accordance with some embodiments of the present disclosure.

Figure 15A:
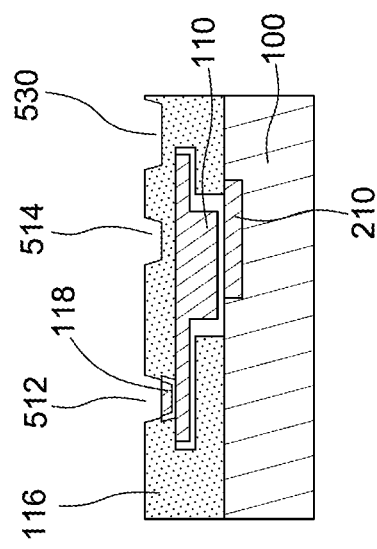
FIG. 15A, FIG. 15B, FIG. 15C, FIG. 15D, FIG. 15E, FIG. 15F, FIG. 15G, FIG. 15H, FIG. 15I, FIG. 15J and FIG. 15K illustrate various operations in a method of manufacturing a semiconductor package in accordance with some embodiments of the present disclosure.

Referring to FIG. 15A, a semiconductor device 100 having a conductive layer 110 is provided, and a dielectric layer 116 is formed over the conductive layer 110. The semiconductor device 100 may include a RDL 210. In some embodiments, conductive elements 118 are formed on the conductive layer 110.

Still referring FIG. 15A, a plurality of recesses 512, 514 and 530 are formed in the dielectric layer 116. It should be noted that although only one of each of the recesses 512, 514 and 530 are shown in FIG. 15A, a plurality of recesses 512, a plurality of recesses 514 and a plurality of recesses 530 may be formed in the dielectric layer 116. In some embodiments, the recesses 512 expose the conductive elements 118. In some embodiments, the recesses 512 and 514 are formed to be distributed at an inner region of the semiconductor device 100 in a substantially uniform manner. In some embodiments, the recesses 530 are formed to be distributed at a peripheral region of the semiconductor device 100 in a substantially uniform manner. In some embodiments, a size of the recesses 530 is greater than a size of the recesses 512 and 514. In some embodiments, an areal density of the recesses 530 is greater than an areal density of the recesses 512 and 514.

In some embodiments, a dimension of one of the recesses 530 is greater than 1.5 times a dimension of one of the recesses 512 and 514. In some embodiments, a depth of the recesses 530 may be substantially the same as a depth of the recesses 512 and 514.

Figure 15B:
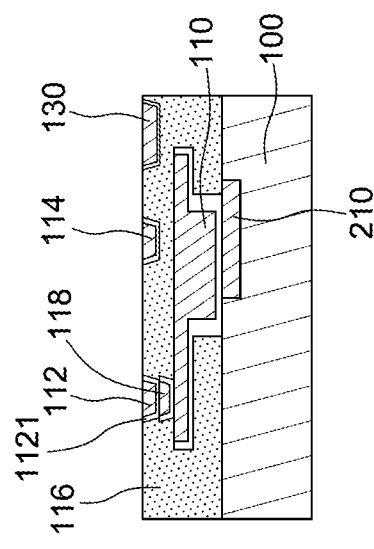
Figure 15C:
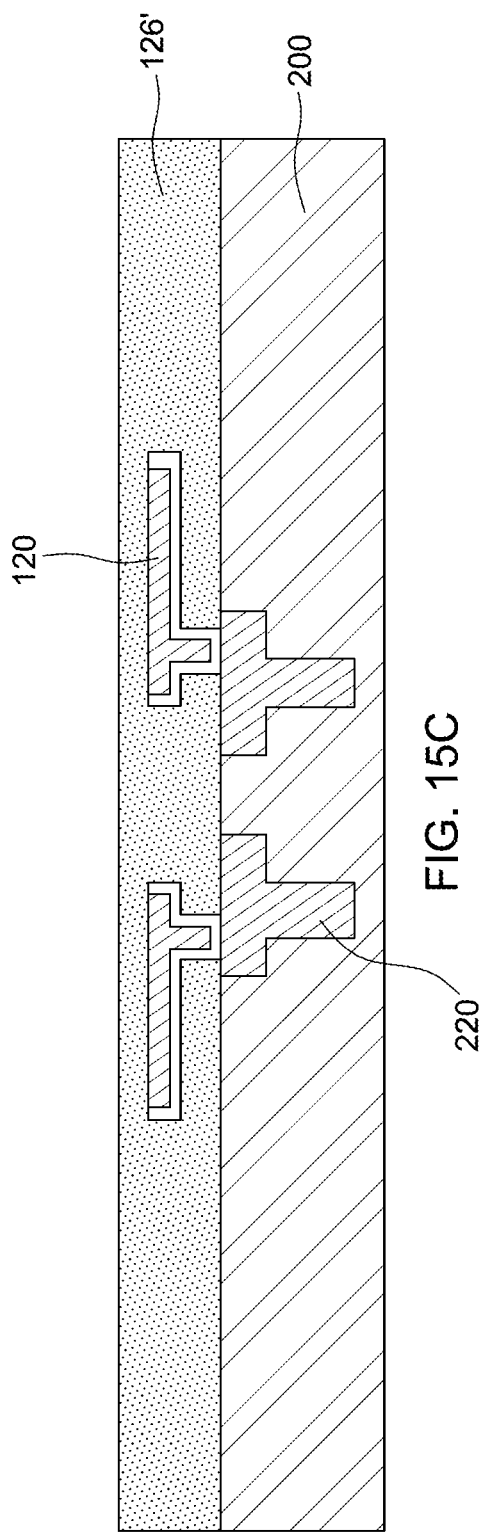

Referring to FIG. 15B, a conductive layer 1121 is formed over the dielectric layer 116 and in the recesses 512, 514 and 530, and a planarization process is performed on the conductive layer 1121 to remove portions of the conductive layer 1121 so as to form a plurality of conductive pads 112 and 114 in the recesses 512 and 514 and a plurality of conductive pads 130 in the recesses 530. A seed layer (not shown in drawings) may be sputtered in the recesses 512, 514 and 530, followed by electroplating the conductive layer on the seed layer. The planarization process may also remove portions of the seed layer. The planarization process may include a chemical mechanical polishing (CMP) process. In some embodiments, the conductive pads 112 are formed on the conductive elements 118 in the recesses 512. In some embodiments, the erosion at the regions of the conductive pads 130 may be greater than the erosion at the regions of the conductive pads 112 and 114 due to the areal density of the conductive pads 130 being greater than the areal density of the conductive pads 112 and 114. Alternatively stated, greater areal density region, or the region having greater metal areal density, is prone to have a deeper recess (i.e., more serious erosion) than the smaller areal density region after the planarization operation. Since the conductive pads 112 and 114 usually serve as I/O connectors to the semiconductor device 100, the extent of erosion to these I/O connectors should not be greater than that of the conductive pads 130, which is usually serving as alignment mark, so that the I/O connectors can be successfully bonded. In some embodiments, the thickness of the conductive pads 112 and 114 may be greater than the thickness of the as-formed conductive pads 130 resulted from the erosion caused by the CMP process.

Referring to FI. 15C, a semiconductor device 200 having a conductive layer 120 is provided, and a dielectric layer 126' is formed over the conductive layer 120. The semiconductor device 200 may include a RDL 220.

Figure 15D:
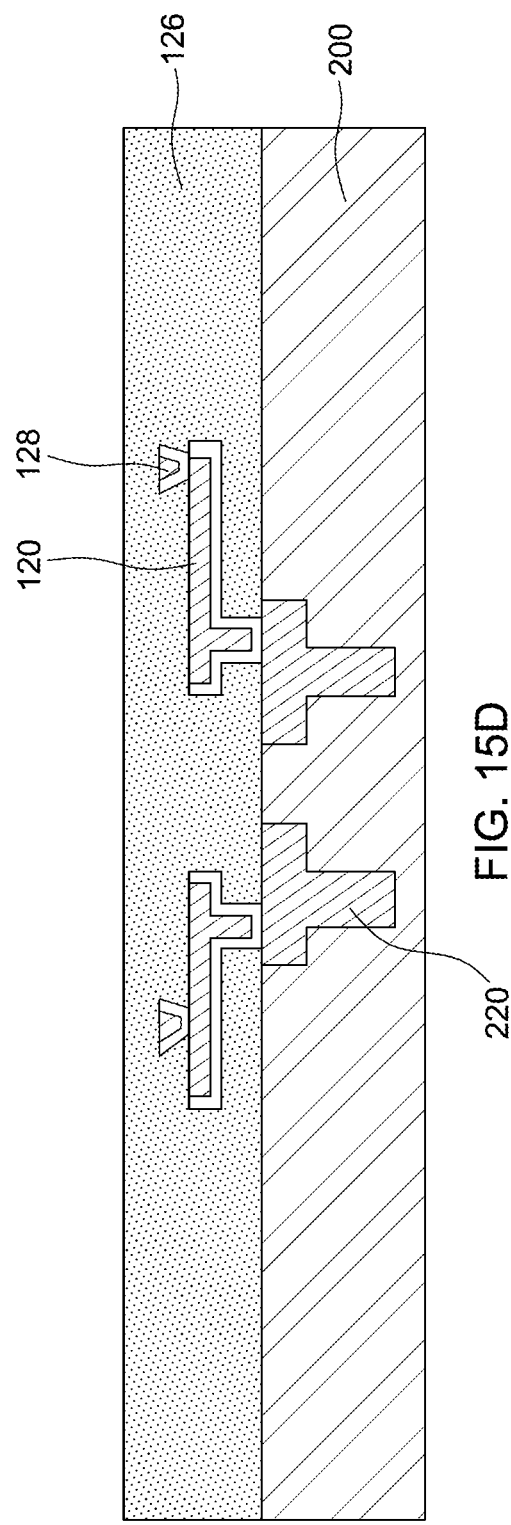

Referring to FIG. 15D, conductive elements 128 are formed on the conductive layer 120, and a dielectric material is further formed the dielectric layer 126' to form a dielectric layer 126. In some embodiments, the dielectric layer 126 covers the conductive elements 128.

Figure 15E:
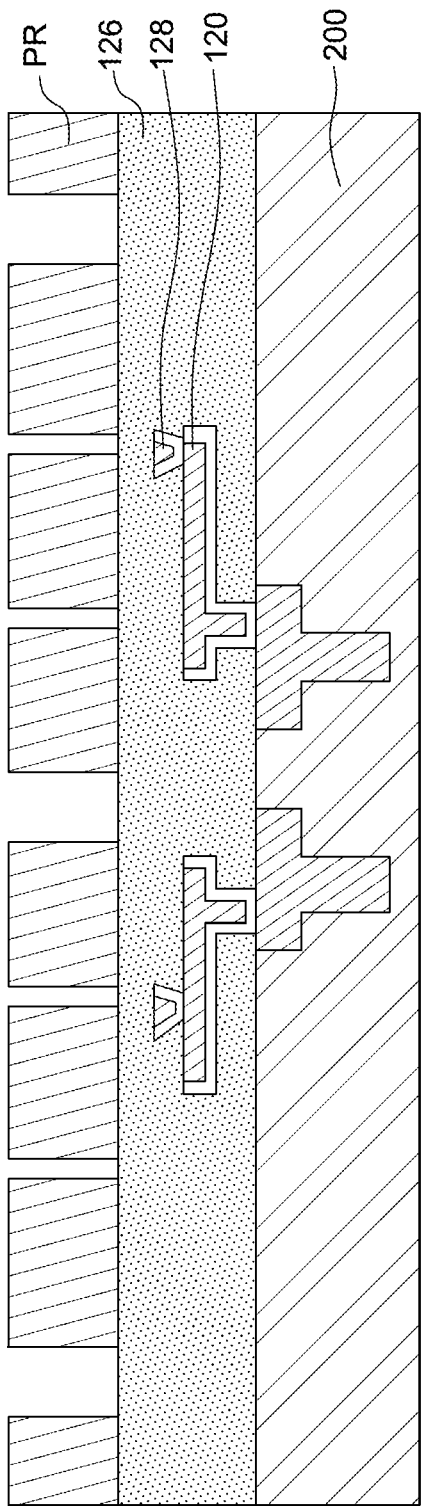

Referring to FIG. 15E, a patterned photoresist PR is formed over the dielectric layer 126. The patterned photoresist PR has a plurality of openings exposing portions of the dielectric layer 126.

Figure 15F:
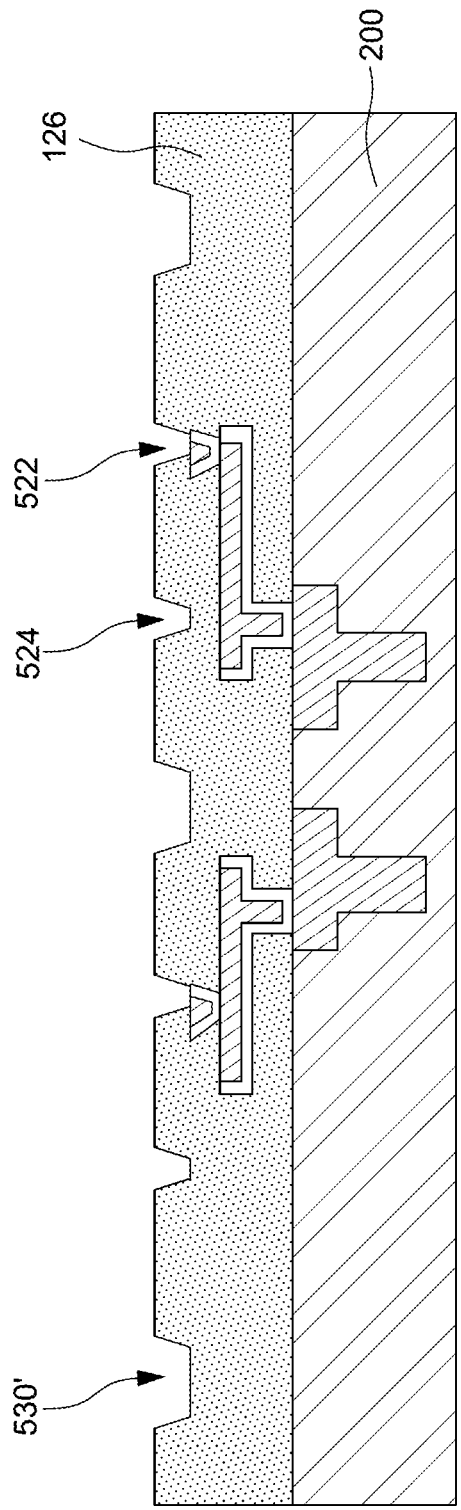

Referring to FIG. 15F, portions of the dielectric layer 126 under the openings of the patterned photoresist PR are removed to form a plurality of recesses 522, 524 and 530' in the dielectric layer 126. In some embodiments, the recesses 522 and 524 are formed to be distributed at a region of the semiconductor device 200 in a substantially uniform manner. In some embodiments, the recesses 530' are formed to be distributed at another region of the semiconductor device 200 in a substantially uniform manner. In some embodiments, a size of the recesses 530' is greater than a size of the recesses 522 and 524. In some embodiments, an areal density of the recesses 530' is greater than an areal density of the recesses 522 and 524.

Figure 15G:
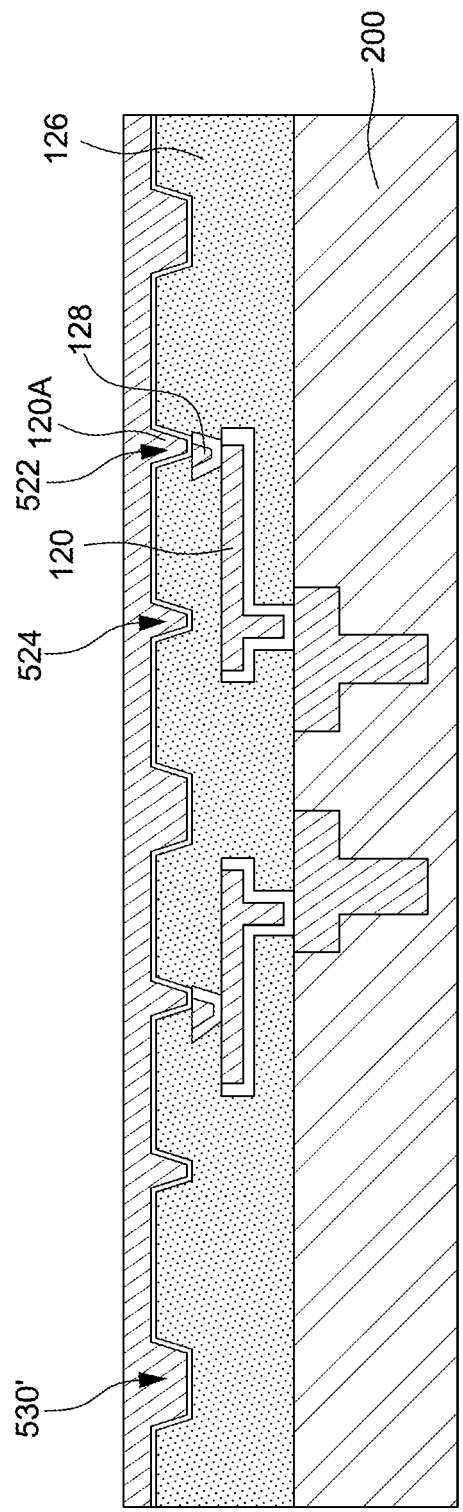

Referring to FIG. 15G, a conductive layer 120A is formed over the dielectric layer 126 and in the recesses 522, 524 and 530'. A seed layer may be formed in the recesses 522, 524 and 530', followed by forming the conductive layer 120A on the seed layer.

Figure 15H:
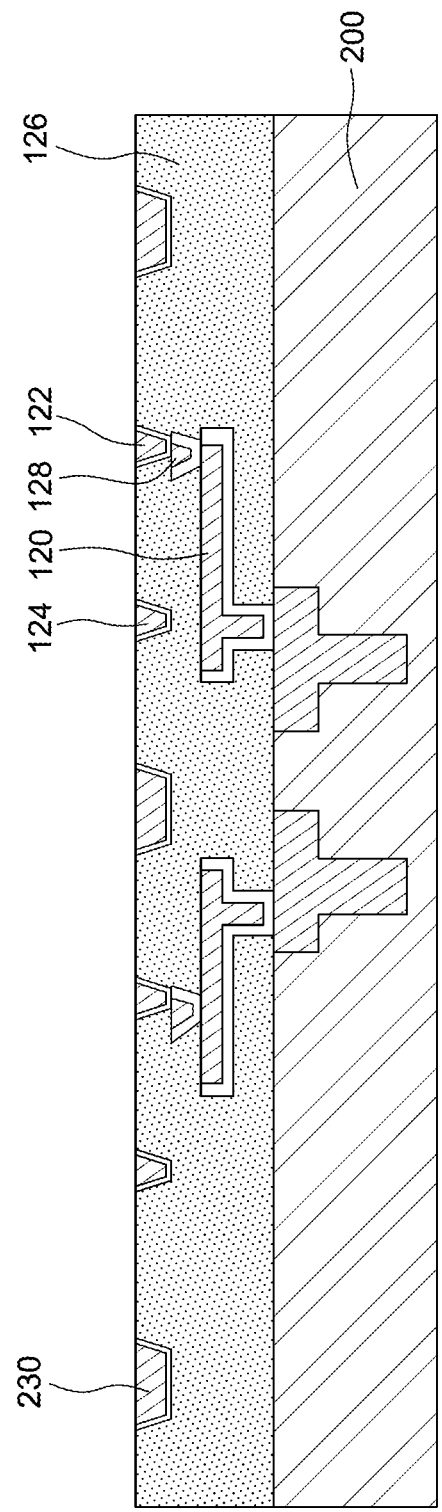

Referring to FIG. 15H, a planarization process is performed on the conductive layer 120A to remove portions of the conductive layer 120A so as to form a plurality of conductive pads 122 and 124 in the recesses 522 and 524 and a plurality of conductive pads 230 in the recesses 530'. Accordingly, the conductive pads 122, 124 and 230 are formed in the dielectric layer 126. In some embodiments, the conductive pads 122 and 124 are distributed at a region in the dielectric layer 126 in a substantially uniform manner.

Figure 15I:
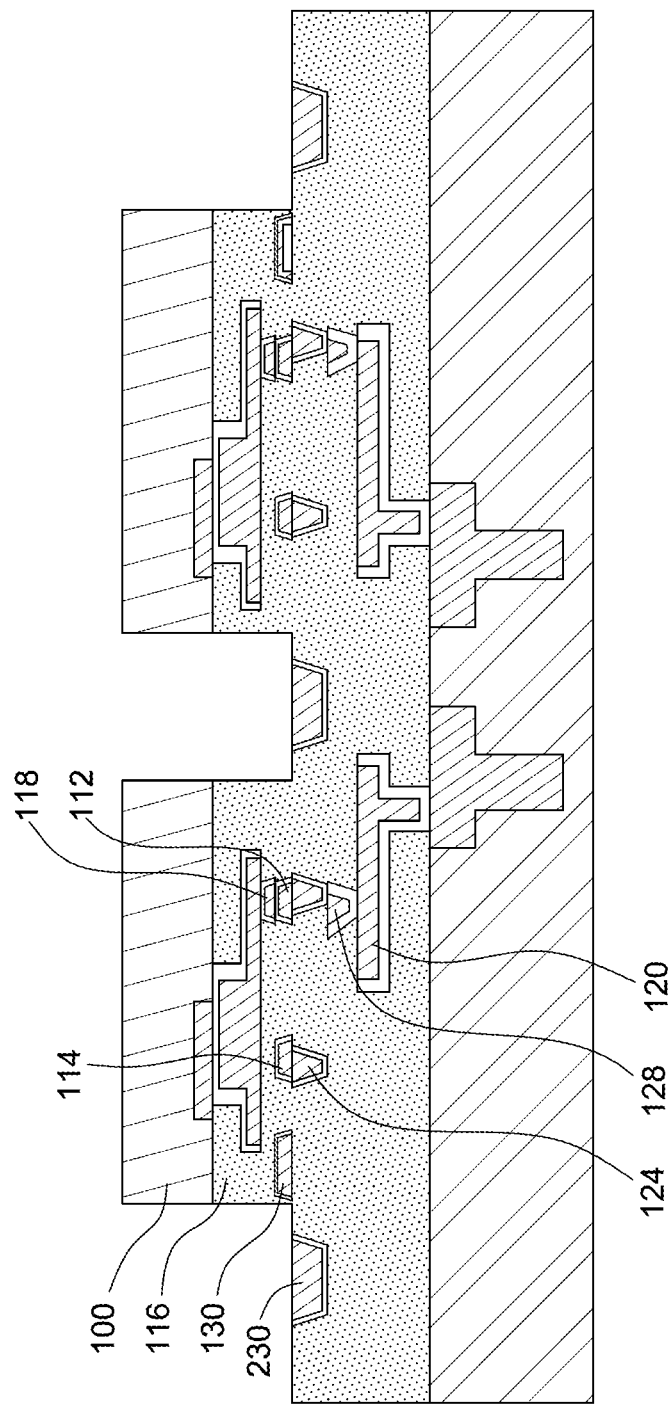

Referring to FIG. 15I, the conductive pads 112 and the conductive pads 124 are attached to the conductive pads 122 and the conductive pads 124, respectively, so as to assemble the semiconductor device 100 to the semiconductor device 200. In some embodiments, at least one of the conductive pads 112 directly contacts at least one of the conductive pads 122. In some embodiments, at least one of the conductive pads 114 directly contacts at least one of the conductive pads 124. In some embodiments, the conductive pads 130 serve as alignment marks for bonding the semiconductor device 100 to the semiconductor device 200. In some embodiments, the conductive pads 230 serve as alignment marks for bonding the semiconductor device 100 to the semiconductor device 200.

Referring to FIG. 15B and FIG. 15I, in some embodiments, the conductive pad 130 can have a thickness substantially identical to or thinner than the conductive pads 112/114 after the planarization operation. In the subsequent hybrid bonding process illustrated in FIG. 15I, the conductive pads 112/114 of the semiconductor device 100 are aligned with the conductive pads 120/124 of the semiconductor device 200, respectively. An annealing operation is performed to foster the interdiffusion between the corresponding conductive pads at the bonding interface. On the other hand, the conductive pad 130 at the semiconductor device 100 is pressed against the dielectric layer 126 instead of another conductive pad on the semiconductor device 200, and hence no interdiffusion is occurred in the conductive pad 130 when performing the aforesaid annealing operation. In some embodiments, the conductive pad 130 is substantially thinner than the conductive pads 112/114 to an extent that the conductive pad 130 is not in contact with the dielectric layer 126, as previously illustrated in FIG. 4, FIG. 5, FIG. 6A, and FIG. 6B.

In some other embodiments, referring to FIG. 11, an encapsulant 140 may be further formed on the dielectric layer 126 and covers a portion of the semiconductor device 100 (not shown in FIGS. 15A-15K). In some other embodiments, referring to FIG. 5, the encapsulant 140 may be formed directly contacting at least one of the conductive pads 130.

Figure 15J:
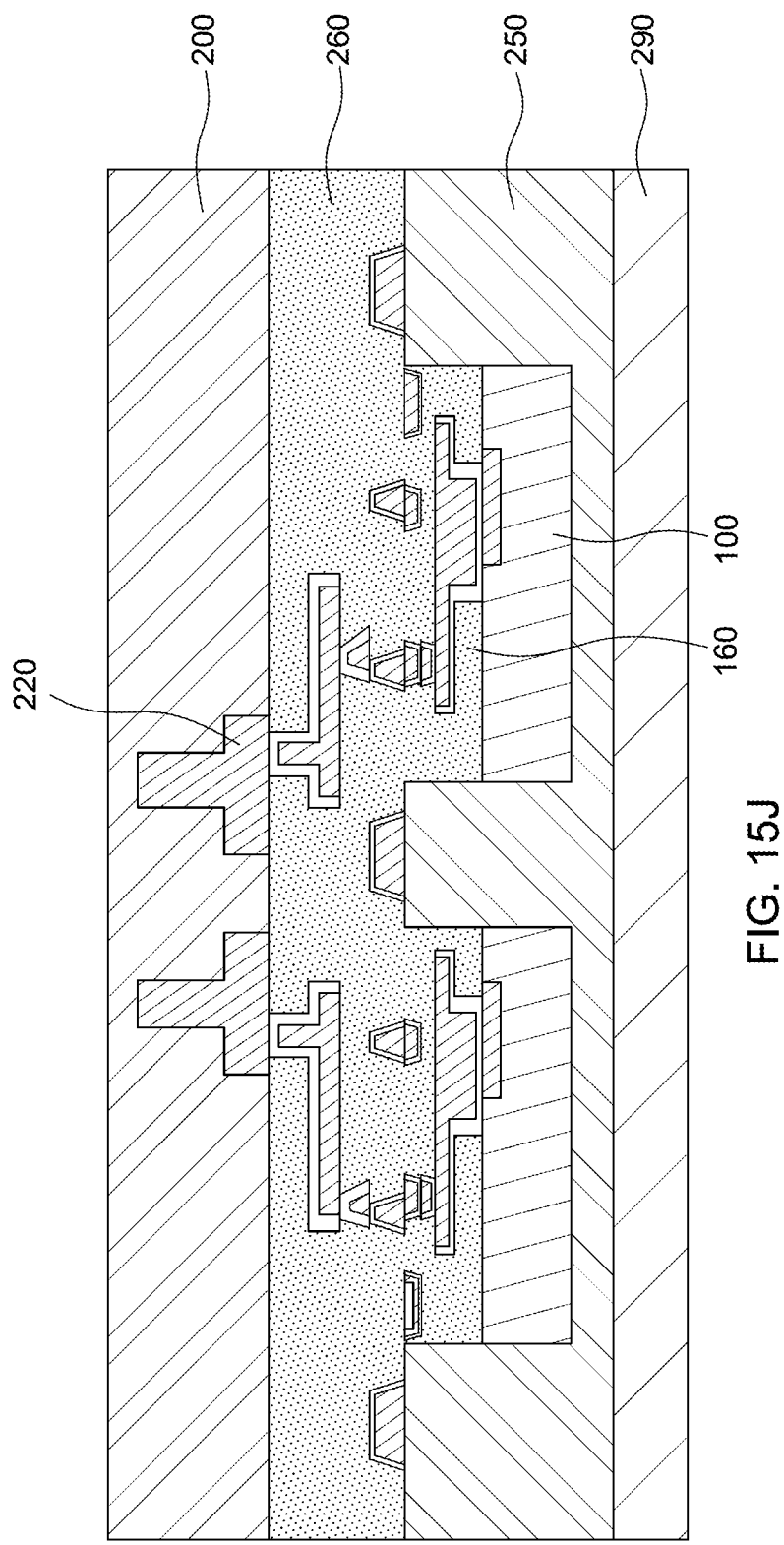

Next, referring to FIG. 15J, an encapsulant 250 is formed on and covering the semiconductor device 100, and then the as-formed structure is flipped over by 180 degrees and disposed on a carrier 290.

Figure 15K:
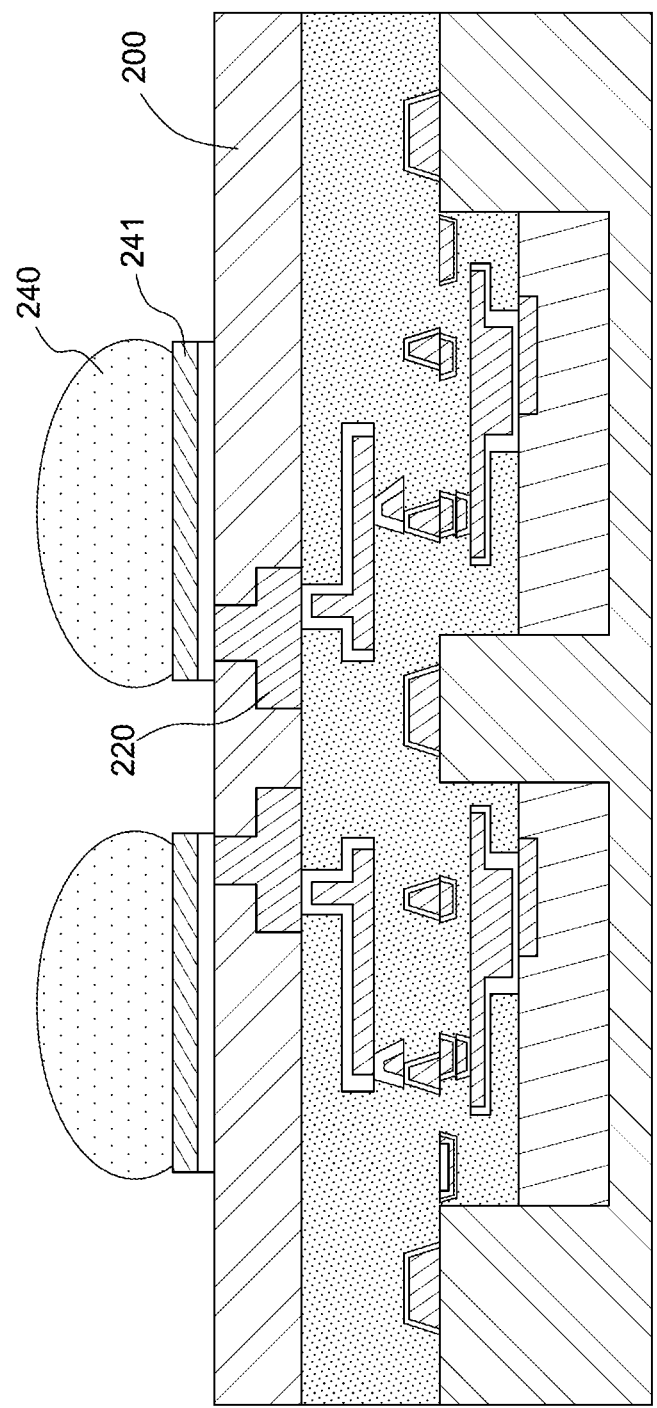

Referring to FIG. 15K, a planarization process is performed on the semiconductor device 200 to expose portions of the RDL 220. In some embodiments, an UBM layer 241 is formed on the semiconductor device 200 and contacting the RDL 220, and an electrical contact 240 is formed on the UBM layer 241. As such, the semiconductor package 5 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package, comprising:
    a first conductive layer;
    at least a first conductive pad electrically connected to the first conductive layer;
    at least a second conductive pad electrically disconnected from the first conductive layer;
    a first dielectric layer accommodating the first conductive pad and the second conductive pad, wherein the second conductive pad is configured to reduce an erosion effect on a surface of the first dielectric layer; and
    a first semiconductor device having a first recess, wherein the first conductive layer is disposed in the first recess.

2. The semiconductor package as claimed in claim 1, wherein the first dielectric layer extends into the first recess of the first semiconductor device.

3. The semiconductor package as claimed in claim 2, wherein the first dielectric layer contacts an inner wall of the first recess of the first semiconductor device and a lateral end surface of the first conductive layer.

4. The semiconductor package as claimed in claim 1, further comprising:
    a second semiconductor device having a second recess; and
    a second conductive layer disposed in the second recess of the second semiconductor device.

5. The semiconductor package as claimed in claim 1, wherein the first conductive pad and the second conductive pad are arranged side-by-side from a cross-sectional view perspective, and a thickness of the first conductive pad is different from a thickness of the second conductive pad.

6. The semiconductor package as claimed in claim 5, wherein the thickness of the second conductive pad is greater than the thickness of the first conductive pad.

7. The semiconductor package as claimed in claim 1, wherein an elevation of the first conductive pad overlaps an elevation of the second conductive pad.

8. The semiconductor package as claimed in claim 1, wherein the first semiconductor device is over which the first conductive pad and the second conductive pad are disposed, and the second conductive pad is closer to an edge of the first semiconductor device than the first conductive pad is.

9. The semiconductor package as claimed in claim 1, further comprising:
    a second dielectric layer contacting the first dielectric layer; and
    a third conductive pad accommodated in the second dielectric layer, wherein the second conductive pad and the third conductive pad are configured to reduce a disconnection between surfaces of the first dielectric layer and the second dielectric layer.

10. The semiconductor package as claimed in claim 1, further comprising:
    a second dielectric layer contacting the first dielectric layer; and
    a third conductive pad accommodated in the second dielectric layer, wherein the third conductive pad contacts the second conductive pad, and a center of the third conductive pad is misaligned with a center of the second conductive pad from a cross-sectional view perspective.

11. The semiconductor package as claimed in claim 10, wherein a thickness of the third conductive pad is greater than a thickness of the second conductive pad.

12. A semiconductor package, comprising:
    a first semiconductor device;
    at least a first conductive pad under a projection area of an inner region of the first semiconductor device;
    at least a second conductive pad under a projection area of a peripheral region of the first semiconductor device, the second conductive pad serving as a first alignment mark; and a second semiconductor device disposed under the first semiconductor device, wherein a width of the second semiconductor device is greater than a width of the first semiconductor device;

wherein the first conductive pad and the second conductive pad are arranged side-by-side, and a thickness of the second conductive pad is less than a thickness of the first conductive pad; and wherein an upper surface of the second conductive pad is recessed from a level of an upper surface of the first conductive pad from a cross-sectional view perspective.

13. The semiconductor package as claimed in claim 12, further comprising a first dielectric layer accommodating the first conductive pad and the second conductive pad, wherein the first dielectric layer comprises a recess, and the second conductive layer is disposed in the recess.

14. The semiconductor package as claimed in claim 12, further comprising:
 a first dielectric layer disposed between the first semiconductor device and the second semiconductor device; and
 a third conductive pad disposed on the first dielectric layer and outside of a region under the projection area of the inner region of the first semiconductor device.

15. The semiconductor package as claimed in claim 14, wherein the third conductive pad serves as a second alignment mark.

16. A semiconductor package, comprising:
 a first semiconductor device;
 at least a first conductive pad under a projection area of an inner region of the first semiconductor device;
 at least a second conductive pad under a projection area of a peripheral region of the first semiconductor device, the second conductive pad serving as a first alignment mark;
 a second semiconductor device disposed under the first semiconductor device, wherein a width of the second semiconductor device is greater than a width of the first semiconductor device; and
 a substrate hybrid-bonded to the first semiconductor device, wherein a gap is defined between the second conductive pad and the substrate.

17. The semiconductor package as claimed in claim 16, further comprising an encapsulant at least partially extending into the gap.

* * * * *